United States Patent
Reytblat

(10) Patent No.: US 8,857,204 B2
(45) Date of Patent: Oct. 14, 2014

(54) REAL TIME INDIVIDUAL ELECTRONIC ENCLOSURE COOLING SYSTEM

(71) Applicant: R4 Ventures, LLC, Scottsdale, AZ (US)

(72) Inventor: Mikhail Pavlovich Reytblat, Chandler, AZ (US)

(73) Assignee: R4 Ventures LLC, Scottsdale, AZ (US)

( * ) Notice: Subject to any disclaimer, the term of this patent is extended or adjusted under 35 U.S.C. 154(b) by 0 days.

(21) Appl. No.: 13/748,088

(22) Filed: Jan. 23, 2013

(65) Prior Publication Data

US 2013/0133350 A1  May 30, 2013

Related U.S. Application Data

(63) Continuation-in-part of application No. 13/624,912, filed on Sep. 22, 2012.

(60) Provisional application No. 61/538,615, filed on Sep. 23, 2011.

(51) Int. Cl.
*F25D 23/12* (2006.01)
*H05K 7/20* (2006.01)

(52) U.S. Cl.
CPC .......... *H05K 7/20718* (2013.01); *H05K 7/2079* (2013.01); *H05K 7/20763* (2013.01); *H05K 7/20836* (2013.01)
USPC .............. 62/259.4; 62/259.2; 62/310

(58) Field of Classification Search
CPC .............................. F28C 2001/06; F28B 9/06
USPC ............. 62/259.2, 259.4, 314, 407, 157, 178, 62/180, 185, 231, 94, 91, 304, 310; 361/688; 165/DIG. 182, 121, 900; 261/147, 153
See application file for complete search history.

(56) References Cited

U.S. PATENT DOCUMENTS

| | | | |
|---|---|---|---|
| 4,380,910 A * | 4/1983 | Hood et al. | 62/91 |
| 4,538,426 A * | 9/1985 | Bock | 62/310 |
| 4,831,832 A | 5/1989 | Alsenz | |
| 4,951,475 A | 8/1990 | Alsenz | |
| 5,076,065 A * | 12/1991 | Brogan | 62/91 |
| 5,265,434 A | 11/1993 | Alsenz | |
| 5,460,004 A * | 10/1995 | Tsimerman | 62/94 |
| 5,570,740 A | 11/1996 | Flores | |
| 5,571,256 A | 11/1996 | Good | |
| 5,600,960 A | 2/1997 | Schwedler | |
| 5,727,393 A | 3/1998 | Mahmoudzadeh | |
| 6,175,502 B1 | 1/2001 | Schaerer | |
| 6,185,098 B1 | 2/2001 | Benavides | |
| 6,336,957 B1 | 1/2002 | Tsymerman | |
| 6,434,236 B1 | 8/2002 | Zorzella | |
| 6,446,941 B1 * | 9/2002 | Maheshwari et al. | 261/130 |
| 6,553,778 B2 | 4/2003 | Tipton | |
| 6,557,960 B2 | 5/2003 | Shih | |

(Continued)

FOREIGN PATENT DOCUMENTS

WO       2011060367  A1     5/2011

*Primary Examiner* — Allana Lewin
*Assistant Examiner* — Raheena Rehman
(74) *Attorney, Agent, or Firm* — Charles E. Runyan

(57) ABSTRACT

A computer server enclosure (such as in a server farm) evaporative cooling system. The system includes multiple cooling towers and includes cooling coil heat transfer equipment locally associated with a server enclosure or group of server enclosures, with the system subject to command and control equipment.

15 Claims, 17 Drawing Sheets

(56) References Cited

U.S. PATENT DOCUMENTS

| | | | |
|---|---|---|---|
| D476,324 S | 6/2003 | Tosh | |
| 6,618,254 B2 | 9/2003 | Ives | |
| 6,857,711 B1 | 2/2005 | Straus | |
| 6,886,353 B2 * | 5/2005 | Patel et al. | 62/180 |
| D514,557 S | 2/2006 | Crisp | |
| 7,062,930 B2 | 6/2006 | Rayburn | |
| 7,086,603 B2 * | 8/2006 | Bash et al. | 236/51 |
| 7,214,131 B2 | 5/2007 | Malone | |
| 7,219,505 B2 | 5/2007 | Weber | |
| D545,816 S | 7/2007 | Frank | |
| D545,817 S | 7/2007 | Frank | |
| 7,251,945 B2 | 8/2007 | Tongue | |
| 7,254,022 B2 | 8/2007 | Ebermann | |
| 7,291,792 B2 | 11/2007 | Chang | |
| 7,313,924 B2 * | 1/2008 | Bash et al. | 62/178 |
| 7,434,415 B2 | 10/2008 | Knight | |
| 7,507,912 B1 | 3/2009 | Sempliner | |
| 7,510,174 B2 * | 3/2009 | Kammerzell | 261/153 |
| 7,599,184 B2 | 10/2009 | Upadhya | |
| 7,619,887 B2 | 11/2009 | Koch | |
| 7,640,760 B2 * | 1/2010 | Bash et al. | 62/178 |
| 7,652,881 B1 | 1/2010 | Sun | |
| 7,694,527 B2 | 4/2010 | Knight | |
| D617,788 S | 6/2010 | Crisp | |
| 7,726,140 B2 | 6/2010 | Rayburn | |
| 7,770,411 B2 | 8/2010 | Knight | |
| 7,813,136 B2 | 10/2010 | Liu | |
| 7,826,230 B2 | 11/2010 | Lee | |
| 7,852,624 B2 | 12/2010 | Sun | |
| 7,855,890 B2 * | 12/2010 | Kashirajima et al. | 361/700 |
| 7,891,993 B2 | 2/2011 | Huber | |
| 7,958,854 B2 | 6/2011 | Al-Shawaf | |
| 7,992,406 B1 | 8/2011 | Reece | |
| 8,018,724 B2 | 9/2011 | Jian | |
| 8,040,693 B2 | 10/2011 | Blomquist | |
| 8,049,109 B2 | 11/2011 | Sempliner | |
| 8,050,027 B2 | 11/2011 | Liang | |
| 8,050,034 B2 | 11/2011 | Ootani | |
| 8,077,455 B2 | 12/2011 | Jian | |
| 2005/0011208 A1 * | 1/2005 | Dobbs et al. | 62/178 |
| 2006/0042295 A1 * | 3/2006 | Assaf | 62/314 |
| 2006/0168975 A1 * | 8/2006 | Malone et al. | 62/180 |
| 2008/0204999 A1 | 8/2008 | Clidaras | |
| 2009/0207564 A1 * | 8/2009 | Campbell et al. | 361/688 |
| 2010/0077776 A1 * | 4/2010 | Takenami et al. | 62/98 |
| 2010/0312498 A1 | 12/2010 | Hamann | |
| 2011/0120693 A1 * | 5/2011 | Kammerzell et al. | 165/201 |
| 2011/0154842 A1 * | 6/2011 | Heydari et al. | 62/259.2 |
| 2011/0239671 A1 * | 10/2011 | Malone et al. | 62/178 |
| 2012/0006038 A1 * | 1/2012 | Sharma et al. | 62/97 |
| 2012/0041600 A1 | 2/2012 | Michael | |
| 2012/0057298 A1 | 3/2012 | Wei | |
| 2012/0144851 A1 * | 6/2012 | Hay | 62/91 |

\* cited by examiner

REAL TIME INDIVIDUAL ELECTRONIC ENCLOSURE COOLING SYSTEM

BACKGROUND

"Data center energy usage has risen dramatically over the past decade and will continue to grow in-step with the processor-intensive applications that support business and day-to-day life in the modern world. The growth of technology has driven the data center into a new phase of expansion, and while data centers themselves may vary over different industry segments, there are common factors influencing all of them including a need to do more with the same resources, or in some cases, even less. To this end, much has been done to increase server efficiency and IT space utilization, but the actual space and cooling infrastructure supporting these intensified loads has often not been properly addressed to keep pace with these developments—an important oversight since cooling can represent up to 42% of a data center's energy usage."

Daniel Kennedy, Rittal White Paper 507: Understanding Data Center Cooling Energy Usage & Reduction.

Available Cooling Systems

Over the years, many methods have been used to cool IT loads in the Data Center environment. The master table below lists some methods commonly used in the industry. These products are available from various manufacturers—some have been available for quite some time and others have just recently been introduced. The table is not a complete list of vendors, but is intended as a reference for some of the most commonly deployed systems.

Table 1 illustrates energy usage by evaluating the energy required to operate the system in kilowatts (kW) versus the cooling capacity provided in tons of cooling/refrigeration (12,000 BTU/hr is equivalent to 1 ton of refrigeration)—a kW/ton rating.

TABLE 1

|  | Availability | Manufacturers | Commonality in the Industry |
|---|---|---|---|
| CRAC Cooled System | 30+ Years | Liebert, DataAire, Stultz | Very Common |
| CRAH Cooled System | 30+ Years | Liebert, DataAire, Stultz | Very Common |
| CRAC Cooled System W/Containment | 5-10 years | The above for Cooling units; containment from Rittal, CPI, Polargy, APC, Knurr | Gaining Widespread Acceptance |
| CRAH Cooled System W/Containment | 5-10 years | The above for Cooling units; containment from Rittal, CPI, Polargy, APC, Knurr | Gaining Widespread Acceptance |
| Liquid Cooled Rack Unoptimized | 8 years | Rittal, APC, Knurr, Liebert, HP | Common |
| Liquid Cooled Racks Chilled Water Temperature Optimized | 8 years | Rittal, HP, Knurr | Less Common |
| Liquid Cooled Racks Chilled Water Temperature Optimized and Free Cooling Systems | 8 years | Rittal, HP, Knurr | Less Common |
| Liquid Cooled Racks Chilled Water Temperature Optimized and Evaporative Free Cooling Systems | 8 years | Rittal, HP, Knurr | Less Common |
| Active Liquid Cooled Doors, Chilled Water Temperature Optimized and Evaporative Free Cooling Systems | 5 years | Rittal | Less Common |
| Passive Liquid Cooled Doors Chilled Water Temperature Optimized and Evaporative Free Cooling Systems | 8 years | Rittal, IBM, Vette | Less Common |
| Pumped Refrigerant Systems | 5 years | Liebert | Less Common |
| Air Side Economizing | 30+ Years | Custom Engineered Solutions with components from various providers | Common |
| Liquid Cooled Servers | 30+ Years | Originally used in mainframes, but proposed 100% heat removal very rare, closest manufacturer would be SprayCool | Rare |

Typical Data Center cooling is accomplished using standard HVAC techniques. That is, the whole building is cooled just as any other building is cooled using supply and return air ductwork, under-floor air distribution space, air inlets, air outlets, etc. Primarily, the air is conditioned at a small number of locations and then moved through ductwork and/or via under-floor air distribution space to a desired outlet location. Once expelled from the outlet, the cooled air mixes with room air. Eventually, the room air enters a server rack where it picks up heat from the servers and the hot air is expelled back into the room where it again mixes with room air. In some slightly more sophisticated systems, the server racks are arranged into aisles, which do a better job of segregating warmed air from cooled air. But in most cases, heat is generated far from the location of the room temperature controllers and far from where heat is removed. This distance causes a big thermal lag or inertia in the system and requires that some areas be over cooled to insure sufficient cooling building wide. This wastes energy. The following table provides data about the capacity, operation; CAPital EXpenditures (CAPEX) and OPerating cost EXpenditures (OPEX) of typical Data Centers where even the oversized cooling systems are unable to provide the required cooling to the all IT Room server rack enclosures.

Data Center LOST capacity is the inability to convert the intended design loading capacity into operational reality, or in other words, resources are not fully utilized. Changes to the Data Center capacity roadmap, i.e. increased Rack load densities, which fail to conform to initial design and design assumptions results in lost capacity. Data Center capacity is LOST when changes from the original design causes space, power, COOLING, or network to become unavailable to the IT equipment. For example, if Rack densities increase from 4 KW per Rack to 8 KW per Rack, the IT load in the average enterprise Data Center is increased from 1×KW to 2×KW, but the COOLING system was initially design for 1×KW plus, in some cases, 50% accounting for unexpected additional COOLING requirements or 1.5×KW. At an increased density to 2×KW per Rack, the Data Center will have to decommission 25% of its Racks reducing its Data Center Capacity by 25% due to lack of COOLING resources. Analysis shows an Annual Cost of Deployed Capital of $8,308 per KW related to Data Center CAPEX and OPEX resulting in substantial costs to the Data Center for loosing capacity due to lack of COOLING.

TABLE 2

Lost Capacity and its Capital Cost to a Data Center
Based on Future Facilities White Paper "The Elephant in the Room is Lost Capacity" and the Uptime Institute Analysis of 1.3 MW Data Center

| | | |
|---|---|---|
| MWs | 1.3 | |
| KWs | 1300 | |
| Annualized CAPEX | $6,300,000 | |
| Annualized OPEX | $3,100,000 | |
| Load Dependent OPEX | $1,400,000 | |
| Total Annual Capital Deployed | $10,800,000 | |
| Total Annual Capital Deployed per KW | $8,308 | |
| Lost Capacity - 20% for 1 year and for 5 years | $2,160,000 | $10,800,000 |
| Lost Capacity - 30% for 1 year and for 5 years | $3,240,000 | $16,200,000 |
| Lost Capacity - 40% for 1 year and for 5 years | $4,320,000 | $21,600,000 |

What is needed is a system of cooling server racks or electronics enclosures that more closely places cooling means near the heat load of the server and which is capable to provide real time cooling for an individual server rack or electronics enclosure based on its load demand.

SUMMARY

Invention embodiments comprise a system comprising a multistage evaporative cooling system and an individual server enclosure cooling system. In various embodiments, the ISECS comprises a housing, a cooling coil unit including a cooling coil mounted in the housing wherein the cooling coil is adapted to circulate a volume of cold water; a fan rack including at least one fan wherein the fan rack is located within or services the housing; and a computer-based command-and-control system in signal communication with one or more sensors configured to sense a cooling parameter wherein the individual server enclosure cooling system is adapted to connect to or sit within a server rack or electronics enclosure and wherein the individual server enclosure cooling system is in fluid communication with a multistage evaporative cooler.

In some embodiments the fan rack and the cooling coil unit sit within the housing at an air inlet to the server rack enclosure; the fan rack and the cooling coil unit sit within the housing at an air outlet from the server rack enclosure; the fan rack sits at an air outlet from the server rack enclosure and the cooling coil units sits at an air inlet to the server rack enclosure; or the fan rack sits at an air inlet to the server rack enclosure and the cooling coil unit sits at an air outlet from the server rack enclosure. Some embodiments use one, two, three, four, or more fans. Similarly, some embodiments use one, two, three, four, or more cooling coils.

Various embodiments draws electrical power at a rate of less than 0.93, 0.9, 0.85, 0.82, 0.80, 0.78, 0.75, 0.73, 0.70, 0.69, 0.65, or 0.60 kilowatts per ton of cooling.

In some embodiments, the system uses a computer-based command-and-control system that monitors a cooling parameter. Some embodiments monitor the cooling parameter and run algorithms that facilitate drawing electrical power at a rate of less than 0.93, 0.9, 0.85, 0.82, 0.80, 0.78, 0.75, 0.73, 0.70, 0.69, 0.65, or 0.60 kilowatts per ton of cooling. In some of these embodiments, the rate of electrical power use is less than 0.60 kilowatts per ton of cooling under appropriate ambient and operating conditions. Sometimes monitoring a cooling parameter encompasses evaluating the instantaneous value, a time-differentiated value, or a time-integrated value of the cooling parameter. In these or in these or other embodiments, the cooling parameter is at least one of air and water temperature; air and water flows, differential air and water pressures, air humidity; electric power consumption (loads) of racks, servers, power distribution units, uninterruptable power supplies, lighting, transformers and switchgear, pumps, fans, motors or combinations of these. In these or other embodiments, the cooling parameters are measured throughout the system such as measured through the individual server enclosure cooling system, in the individual server enclosure cooling system, or at some point within the server rack enclosure or within some other part of the building.

In some embodiments, the computer-based command-and-control system adjusts at least one cooling control that manipulates a control parameter. In these or other embodiments, a control parameter is any one or any combination of fan speed for one or more fans; cooling fluid pump speed for one or more cooling coils; cooling fluid flow rate for one or more cooling coils; cooling fluid temperature for one or more cooling coils; or cooling air flow rate. Invention computer-based command-and-control system may monitor one or more cooling parameters or adjusts one or more cooling controls such that the average temperature of air moving through the server rack enclosure remains within 5, 4, 3, 2, 1, 0.75, or 0.5 degrees of a set point temperature.

In some system embodiments, the cooling coil unit sits near the air outlet of the server rack enclosure and comprises at least two cooling coils and wherein the fan rack sits disposed cooling coil unit, wherein the cooling coil unit and the fan rack are disposed within the housing; and wherein the individual server enclosure cooling system sits under a floor supporting the server rack enclosure or sits within the server rack enclosure.

In some embodiments, an invention system comprises a multistage evaporative cooling system and an individual server enclosure cooling system adapted to connect to a server rack enclosure or located within a server rack enclosure, wherein the individual server enclosure cooling system comprises a housing; a cooling coil unit including a cooling coil mounted in the housing wherein the cooling coil is adapted to circulate a volume of cold water; a fan rack including at least one fan wherein the fan rack is located within or services the housing; and a computer-based command-and-control system in signal communication with one or more sensors configured to sense a cooling parameter and that monitors at least one cooling parameter by evaluating an instantaneous value, a time-differentiated value, or a time-integrated value of the cooling parameter wherein the cooling parameter is at least one of air and water temperature; air and water flow; differential air and water pressures; air humidity; or electric power consumption of racks, servers, power distribution units, uninterruptable power supplies, lighting, transformers, switchgear, pumps, fans, or motors and the cooling parameter is measured through the individual server enclosure cooling system, in the individual server enclosure cooling system, or at some point within the server rack enclosure or within some other part of the building and wherein the computer-based command-and-control system is capable of adjusting at least one cooling control that manipulates a control parameter comprising fan speed for one or more fans; cooling fluid pump speed for one or more cooling coils; cooling fluid flow rate for one or more cooling coils; cooling fluid temperature for one or more cooling coils; or cooling air flow rate such that the average temperature of air moving through the server rack remains within 5, 4, 3, 2, 1, 0.75, or 0.5 degrees of a set point temperature and wherein the fan rack and the cooling coil unit sit within the housing at an air inlet to the server rack enclosure; the fan rack and the cooling coil unit sit within the housing at an air outlet from the server rack enclosure; the fan rack sits at an air outlet from the server rack enclosure and the cooling coil units sits at an air inlet to the server rack enclosure; or the fan rack sits at an air inlet to the server rack enclosure and the cooling coil unit sits at an air outlet from the server rack enclosure and wherein the system draws electrical power at a rate of less than 0.93, 0.9, 0.85, 0.82, 0.80, 0.78, 0.75, 0.73, 0.70, 0.69, 0.65, or 0.60 kilowatts per ton of cooling. In some of these embodiments, the rate of electrical power use is less than 0.60 kilowatts per ton of cooling under appropriate ambient and operating conditions.

FIGURES

DETAILED DESCRIPTION

Figure 1:
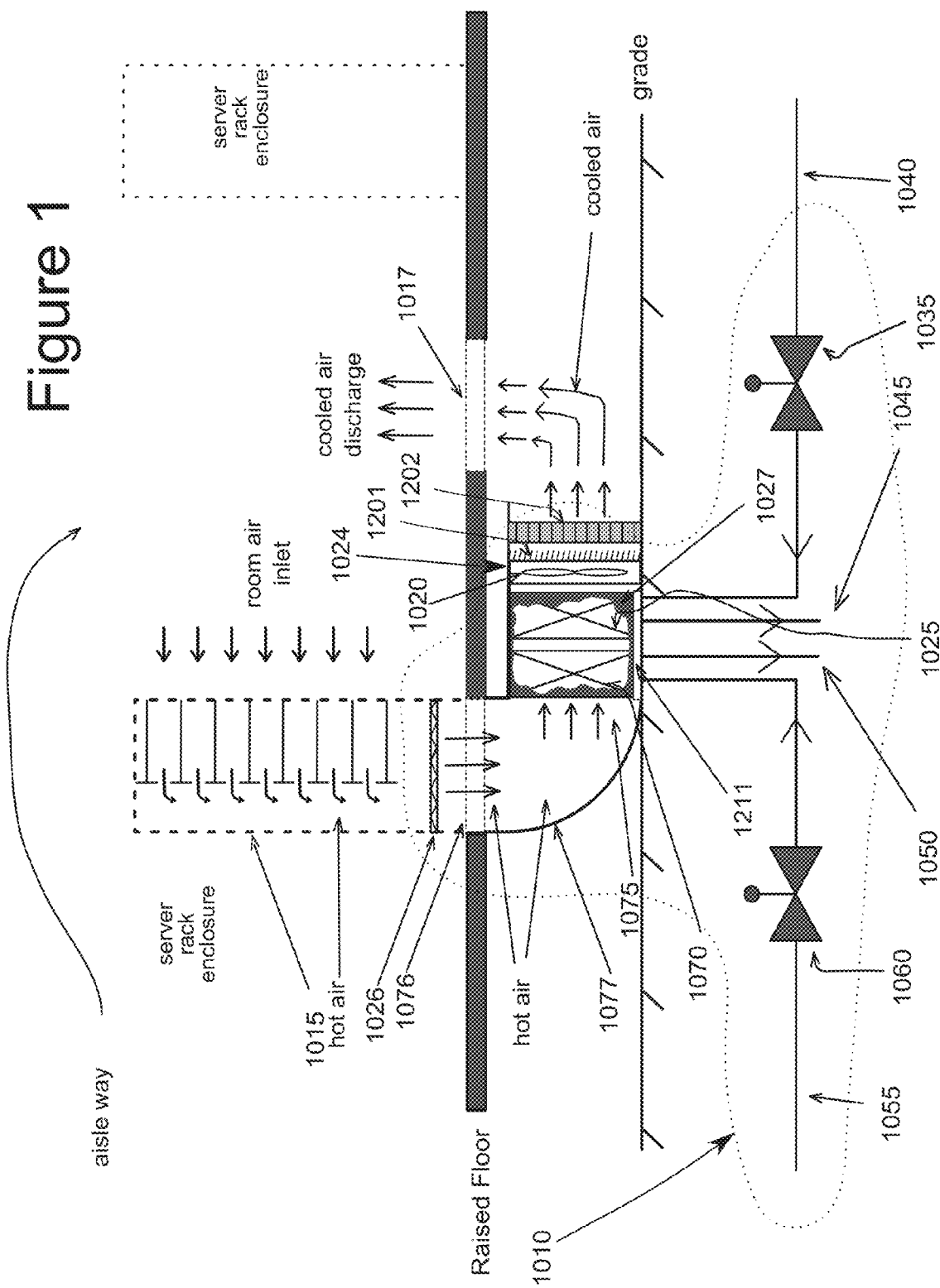
FIG. 1 depicts a variation of an ISECS with an under-floor outlet.

The following description of several embodiments describes non-limiting examples that further illustrate the invention. No titles of sections contained herein, including those appearing above, are limitations on the invention, but rather they are provided to structure the illustrative description of the invention that is provided by the specification.

Unless defined otherwise, all technical and scientific terms used in this document have the same meanings that one skilled in the art to which the disclosed invention pertains would ascribe to them. The singular forms "a", "an", and "the" include plural referents unless the context clearly indicates otherwise. Thus, for example, reference to "fluid" refers to one or more fluids, such as two or more fluids, three or more fluids, etc. Any mention of an element includes that element's equivalents as known to those skilled in the art.

Any methods and materials similar or equivalent to those described in this document can be used in the practice or testing of the present invention. This disclosure incorporates by reference all publications mentioned in this disclosure and all of the information disclosed in the publications.

This disclosure discusses publications only to facilitate describing the current invention. Their inclusion in this document is not an admission that they are effective prior art to this invention, nor does it indicate that their dates of publication or effectiveness are as printed on the document.

The features, aspects, and advantages of the invention will become more apparent from the following detailed description, appended claims, and accompanying drawings.

Individual Server Enclosure Cooling System (ISECS)

In various embodiments, an invention individual server enclosure cooling system or a rack cooling system or electronics enclosure cooling system (collectively ISECS) uses a process cooling model to cool the equipment inside of the rack or enclosure with real time monitoring and control over the cooling needs of the IT and other Data Center support equipment. In some embodiments, the cooling needs of a rack or electronics enclosure range from 500 watts to ±50 kW, 1 kW to ±40 kW, or 3 kW to ±35 kW. In some embodiments, an invention ISECS connects with a real time monitoring and control system, as described below. In some embodiments, an invention ISECS connects to a Multistage Evaporative Cooling System (MECS), as described below. In some embodiments, an invention ISECS connects to a Multistage Evaporative Cooling System and a real time monitoring and control system. In some invention embodiments, when connected to the MECS, the invention ISECS receives cold water at temperatures of 61±4° F., 61±5° F., 61±10° F., 61±15° F., or 61±20° F.

This invention among other things applies semiconductor clean room process cooling methods to Data Center or mission critical environments providing real-time, load-based process cooling at the server rack or electronics enclosure and eliminating hot and cold aisles by combining the Multistage Evaporative Cooling System (MECS—the cold water generating source), ISECS (ISECS), and Real Time Monitoring and Control System (RTMCS).

Invention embodiments comprise cooling systems that are coupled with the server rack or electronics enclosure containing the heat load. In some embodiments, ISECS attaches to server racks or electronics enclosures. ISECS or a local cooling system comprises a housing within which sits a cooling coil or multiple cooling coils and a fan or multiple fans. The housing may additionally comprise air filters, dampers, condensate pan, condensate removal means, etc. ISECS also contains sensors and controllers attached to control system that enable the control system to supply cooling capacity matched to the real-time needs of an individual server rack or electronics enclosure.

FIG. 1, FIG. 2, FIG. 3, and FIG. 4 depict invention ISECS 1010 for placement beneath a raised floor of one or more server rack enclosures 1015 or electronics enclosures 1015. (Sometimes throughout this document server racks and electronics enclosures are referred to collectively as server rack enclosure(s).) Alternatively, ISECS 1010 may sit in a crawl space or basement beneath server rack enclosure 1015. ISECS 1010 comprises hot air inlets 1076 into housing 1075 through hot air duct elbow 1077. One or more fan racks 1024 and one or more cooling coil units 1027 are disposed within housing 1075. Fan rack 1024 comprises one or more fans 1020. Cooling coil unit 1027 comprises one or more final cooling coils 1025, and optionally one or more pre-cooling coils 1070 are disposed within housing 1075. In some embodiments, at least one pre-cooling coil 1070 is disposed upstream of final cooling coil 1025 within cooling coil unit 1027. FIG. 1 shows fan rack 1024 located downstream of cooling coil unit 1027, but other embodiments exist in which fan rack 1024 is located anywhere along the air path through housing 1075. Thus, some embodiments locate fan rack 1024 without respect to the location of cooling coil unit 1027, final cooling coil 1025, or pre-cooling coil 1070.

Hot air inlet 1076 into ISECS 1010 may attach to a standard server rack enclosure 1015 though hot air duct elbow 1077. ISECS 1010 in the embodiment depicted in FIG. 1, FIG. 2, FIG. 3, and FIG. 4 vents to the region below the raised floor. Cool air exits ISECS 1010 into the region underneath the raised floor and in some embodiments air returns to the server room through cold air discharge grill 1017 located within the aisle way between rows of server rack enclosures 1015. Some embodiments employ a condensate pan 1211 that captures water that condenses on the pre-cooling coil 1070 or the final cooling coil 1025, or both.

Figure 2:
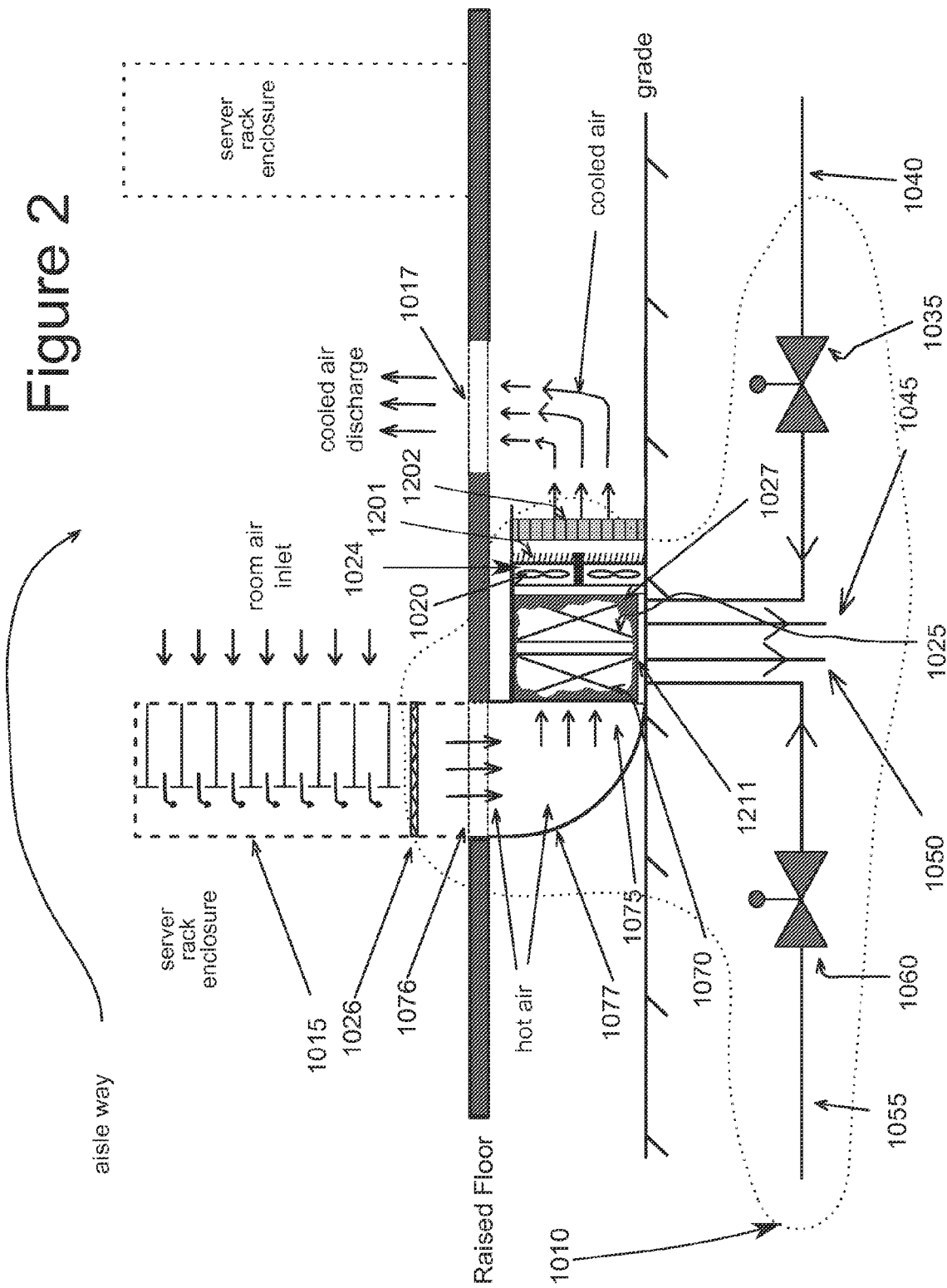
FIG. 2 depicts another variation of an ISECS with an under-floor outlet and two fans.

FIG. 2 depicts an invention embodiment substantially like that of FIG. 1. The difference in this embodiment from that of the FIG. 1 embodiment is that FIG. 2 depicts fan rack 1024 comprising two fans 1020.

Figure 3:
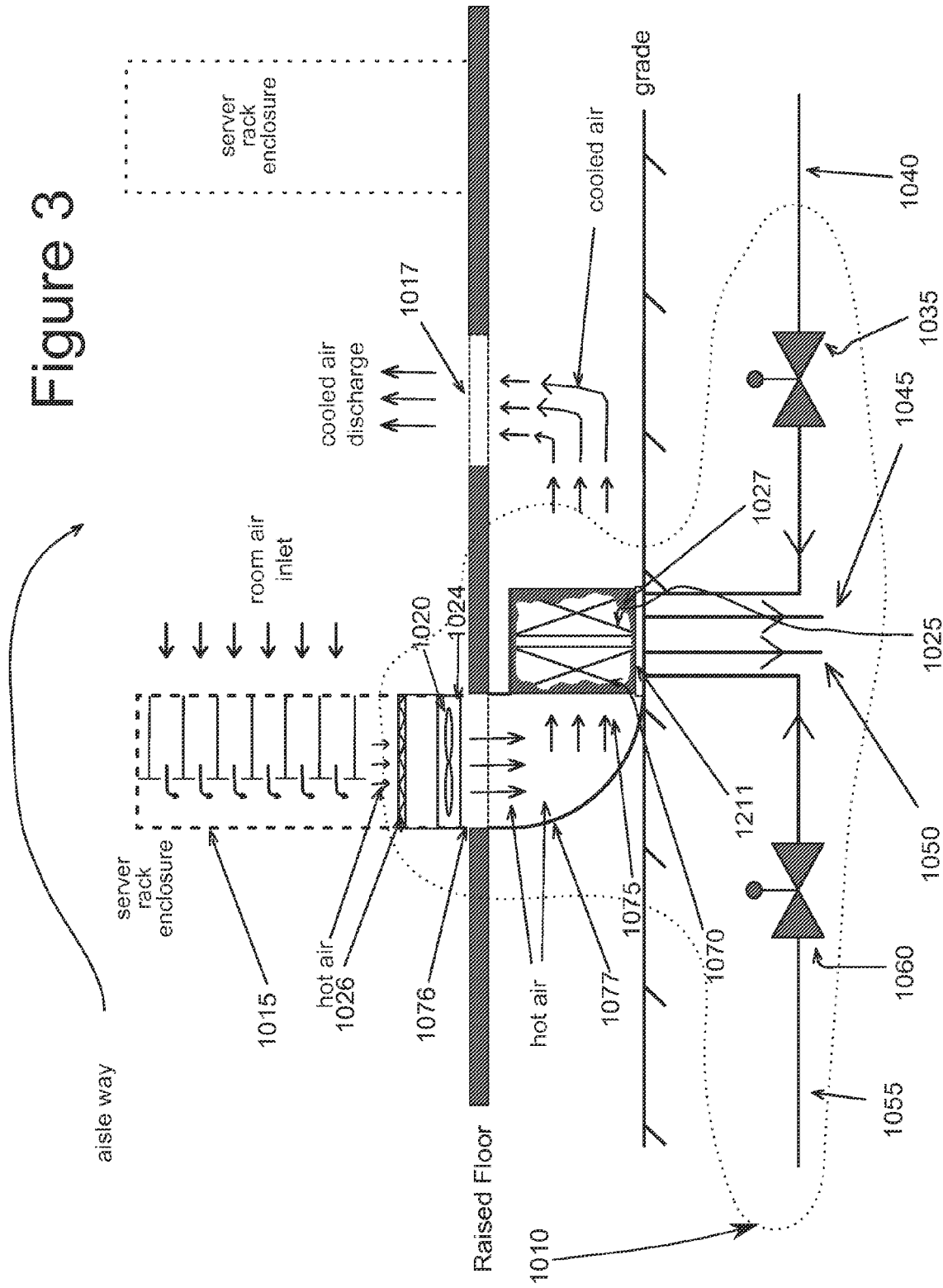
FIG. 3 depicts another variation of an ISECS with an under-floor outlet and a rack-mounted fan.

FIG. 3 depicts an invention embodiment substantially like that of FIG. 1. The difference in this embodiment from that of the FIG. 1 embodiment is that fan rack 1024 is located in server rack enclosure 1015.

Figure 4:
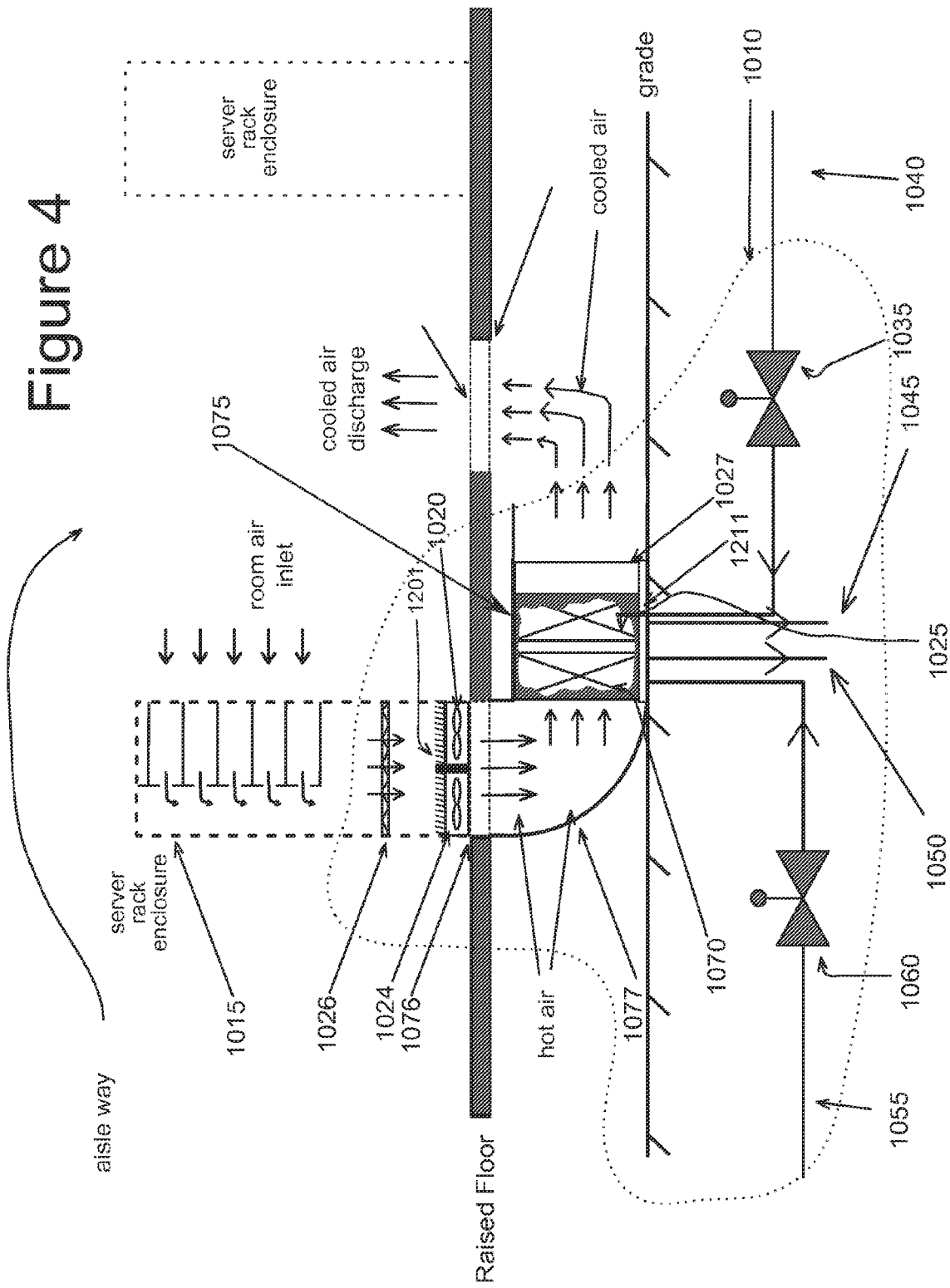
FIG. 4 depicts another variation of an ISECS with an under-floor outlet and dual rack-mounted fans.

FIG. 4 depicts fan rack 1024 located similarly to FIG. 3, except fan rack 1024 comprises two fans 1020.

Figure 5:
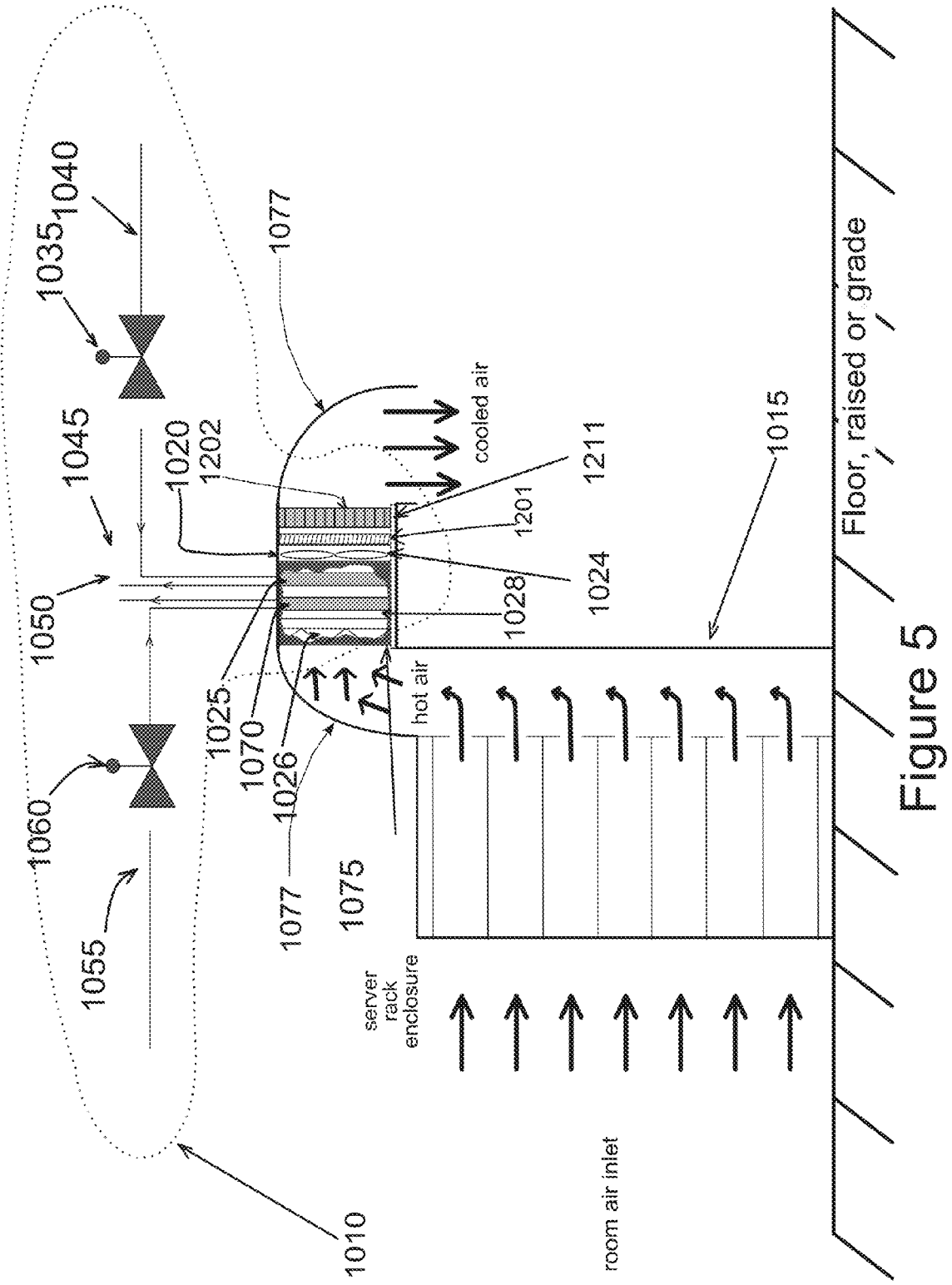
FIG. 5 depicts another variation of an ISECS with an overhead outlet and an overhead fan.

FIG. 5 depicts ISECS 1010 similar to the embodiments of this invention discussed above, but in which ISECS 1010 is adapted to mount to the top of server rack enclosure 1015. In this embodiment, ISECS 1010 comprises housing 1075 connected to the top of server rack enclosure 1015. Housing 1075 contains, in order, an insulated hot air duct 1077 (in some embodiments an elbow), air filter 1026; followed by cooling coil unit 1027, comprising pre-cooling coil 1070 and final cooling coil 1025; fan rack 1024, comprising at least one fan 1020; and automatic air damper 1201 and a louver door 1202 that provides access to fan rack 1024. In some embodiments similar to FIG. 5, louver door 1202 comprises safety features that prevent fan 1020 from operating when louver door 1202 is open. In these or other embodiments, an air duct 1074 (in some embodiments, an elbow) sits at the end of housing 1075 providing duct work for air to exit ISECS 1010 from.

Figure 6:
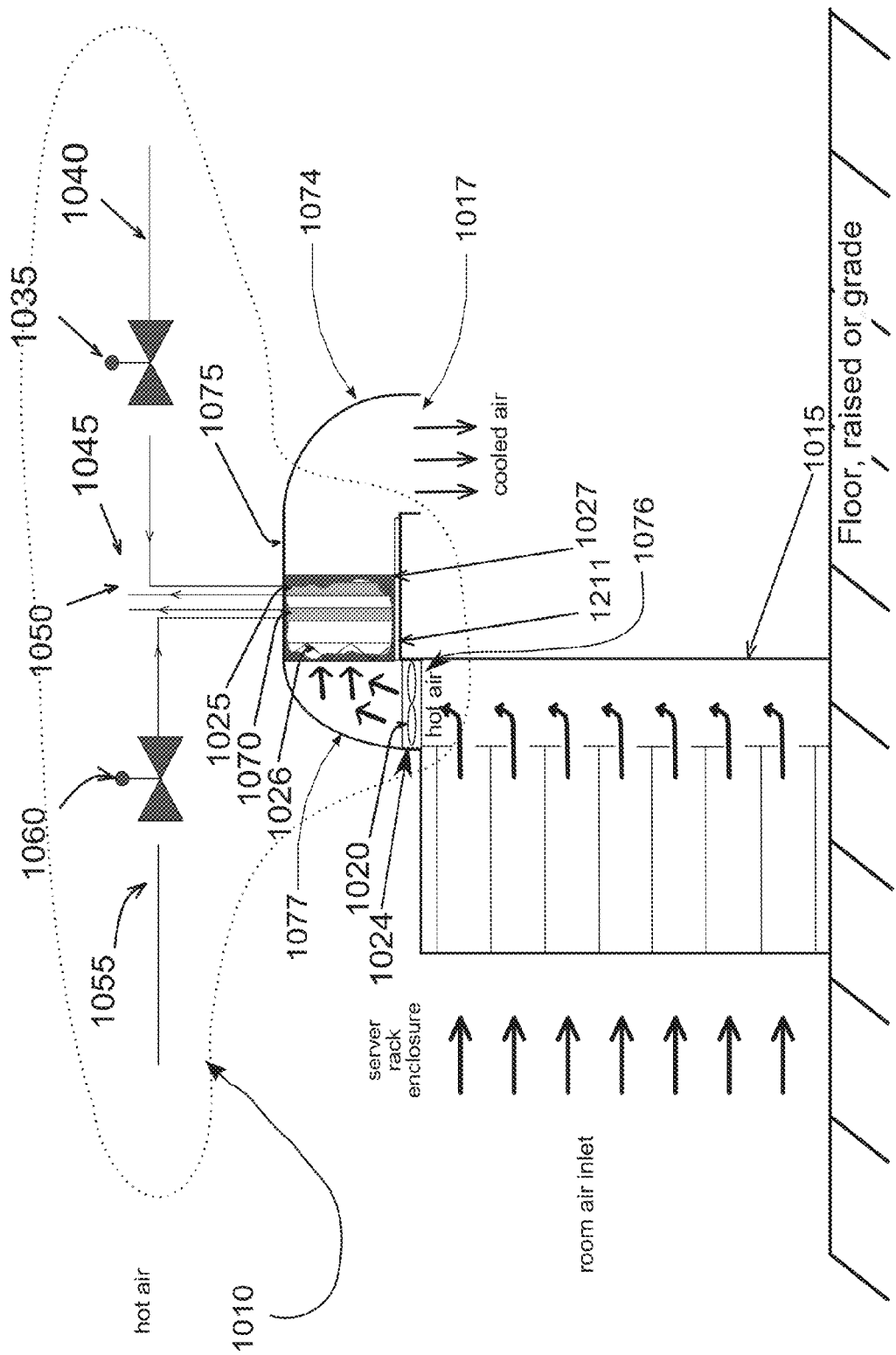
FIG. 6 depicts another variation of an ISECS with an overhead outlet and a rack-mounted fan.

FIG. 6 depicts a cooling system embodiment that is similar to the embodiment shown in FIG. 5. FIG. 6 shows ISECS 1010 in which fan rack 1024 sits at the outlet to server rack enclosure 1015.

Figure 7:
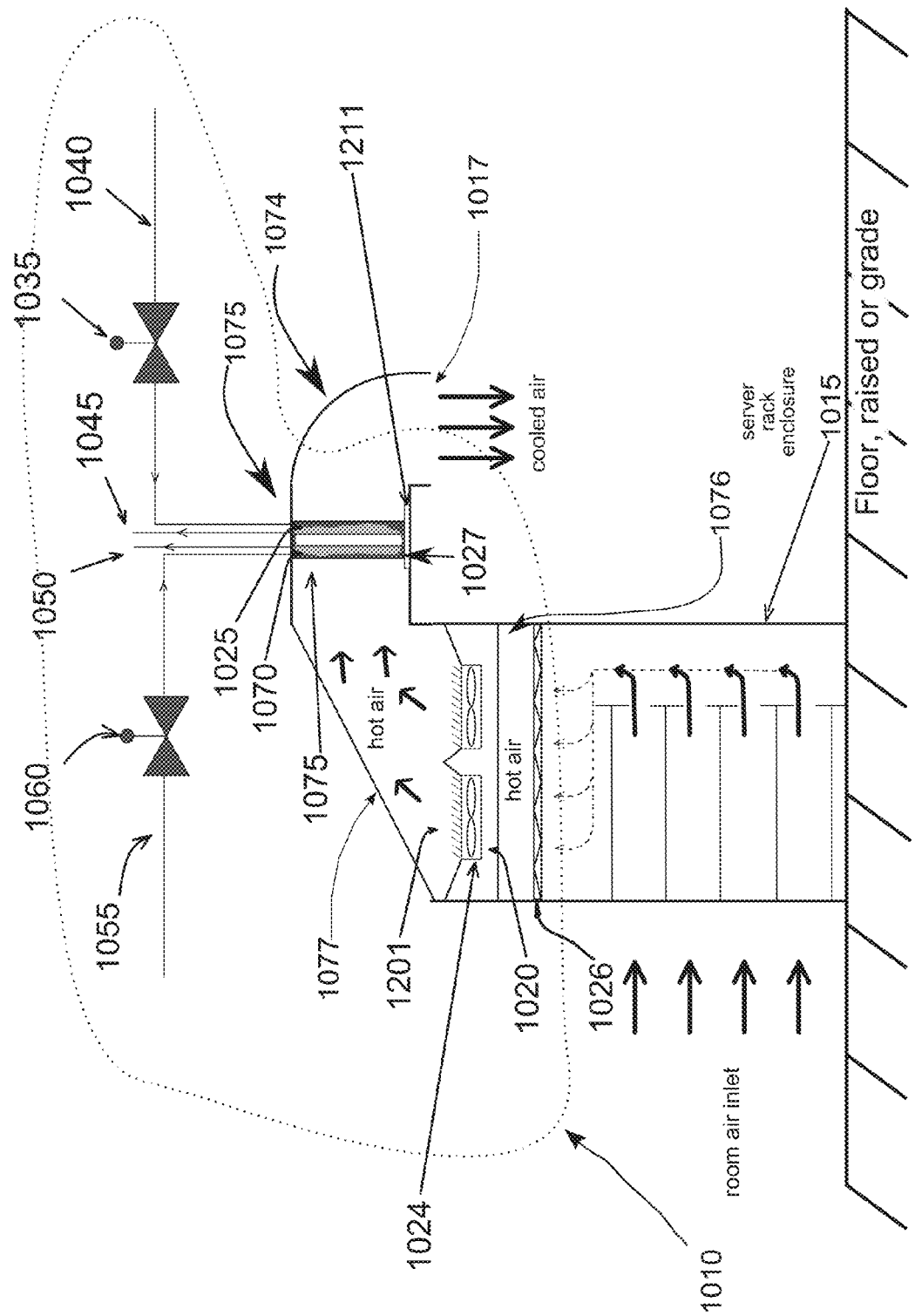
FIG. 7 depicts another variation of an ISECS with an overhead outlet and dual rack-mounted fans.

FIG. 7 depicts a cooling system embodiment similar to that of FIG. 6 but in which fan rack 1024 comprises two or more fans 1020.

Figure 8:
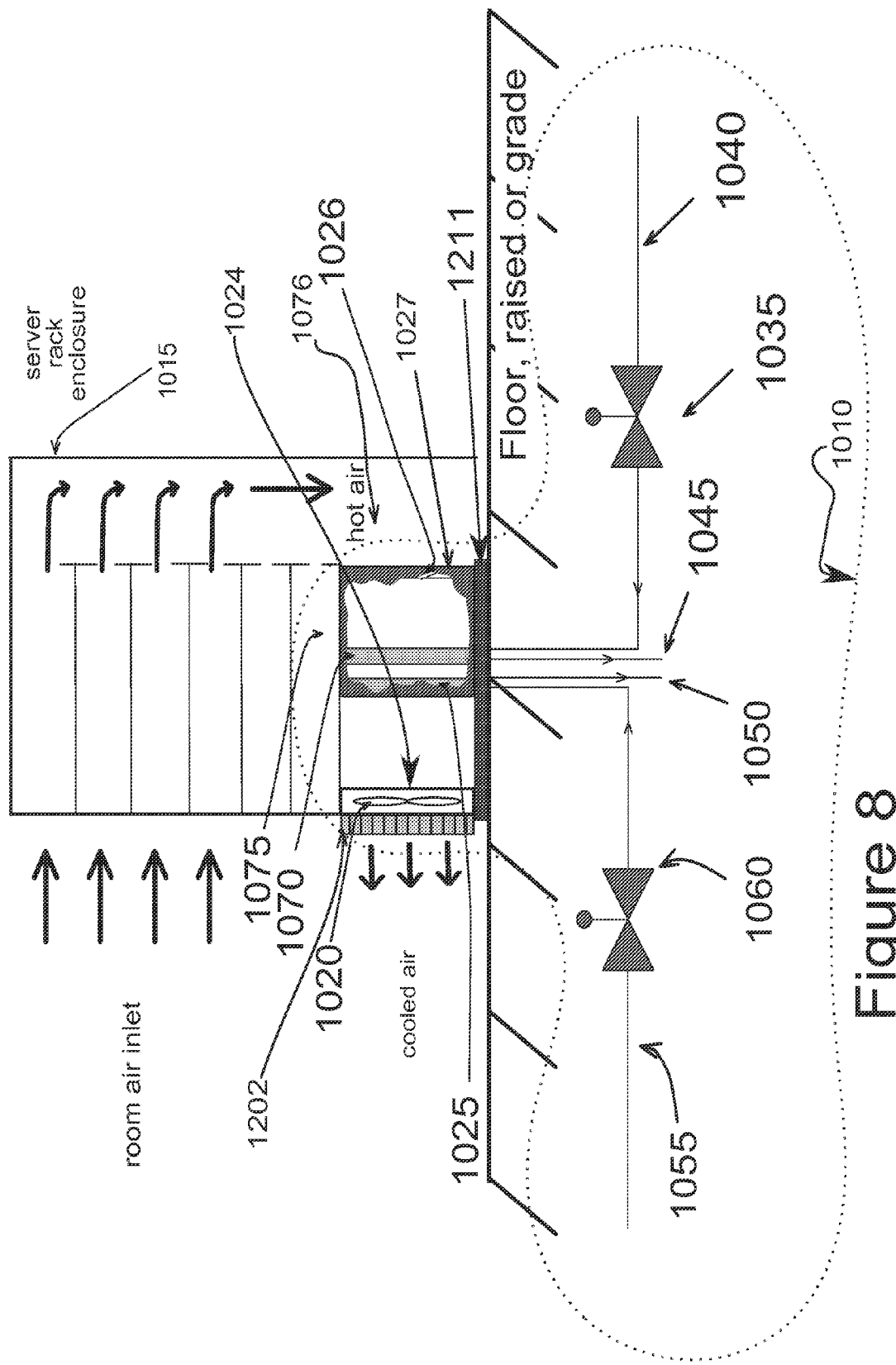
FIG. 8 depicts another variation of an ISECS mounted within a server rack enclosure.
Figure 9:
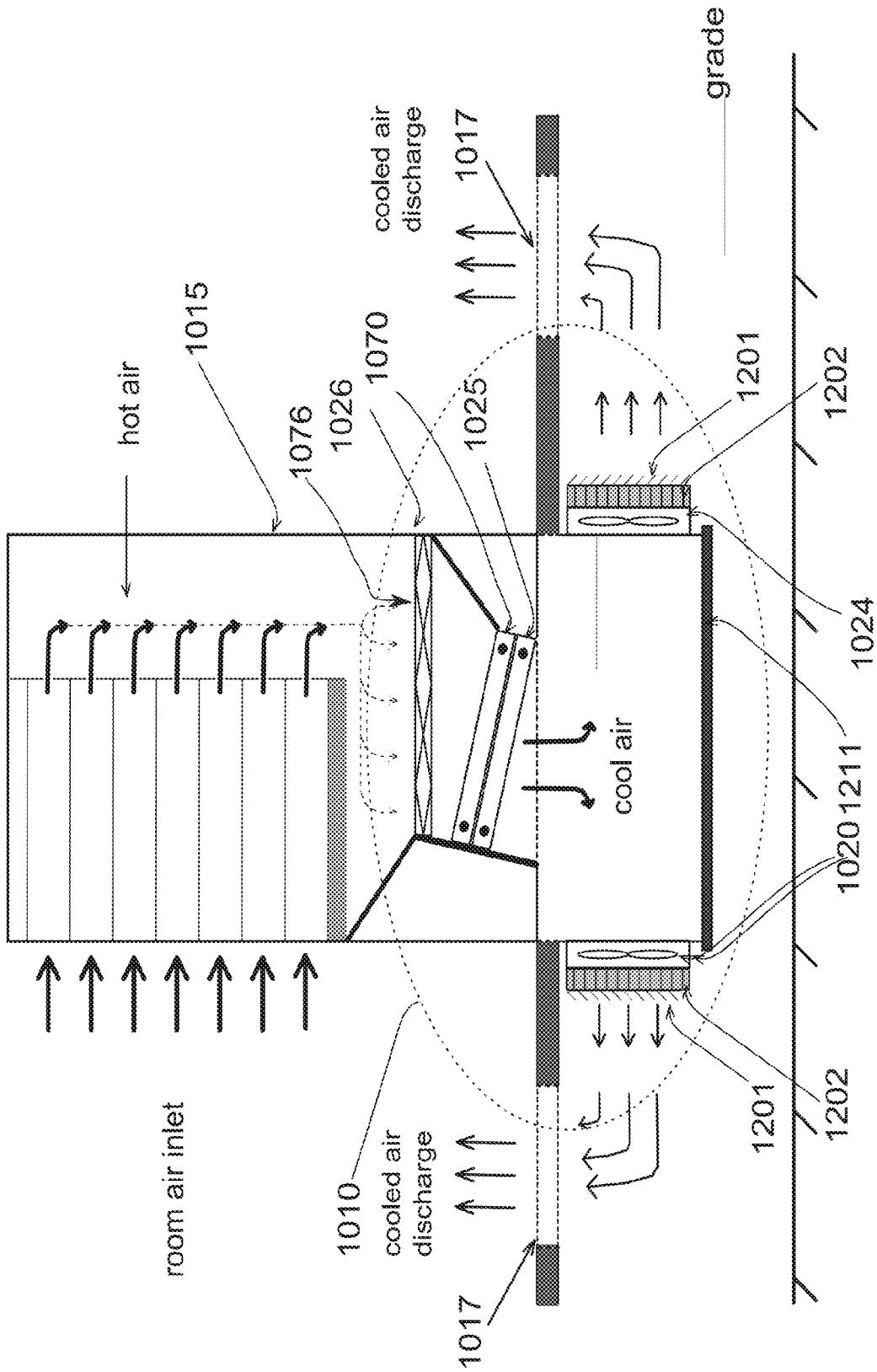
FIG. 9 depicts another variation of an ISECS mounted within a server rack enclosure.

FIG. 8 depicts a cooling system embodiment in which ISECS 1010 is housed within server rack enclosure 1015. In this specific embodiment, ISECS 1010 sits beneath the servers of server rack enclosure 1015. In other embodiments, ISECS 1010 sits above the servers. This embodiment of ISECS 1010 comprises air filter 1026; followed by cooling coil unit 1027, comprising pre-cooling coil 1070 and final cooling coil 1025; fan rack 1024, comprising at least one fan 1020; and louver door 1202.

In some embodiments, housing 1075 is constructed of standard HVAC sheet metal using standard HVAC construction methods. But in other embodiments, housing 1075 is constructed using different methods or materials as is known to those of ordinary skill in the art.

In some embodiments, fan 1020 sits after a final cooling coil 1025 or pre-cooling coil 1070. In these or other embodiments, two, three, or more fans compose fan rack 1024, which sits within housing 1075 of ISECS 1010. In some embodiments, each fan 1020 has the same air-handling capacity as the others. In some embodiments, fans 1020 have different air-handling capacities. Moreover, separate fans 1020 may service pre-cooling coils 1070 and final cooling coils 1025, in some embodiments. Some of these embodiments divide the air path into two or more paths. To prevent air back flow into ISECS 1010, some invention ISECS 1010 comprise one or more automatic air dampers 1201.

Similarly, in some embodiments ISECS may comprise two or more cooling coils. Some embodiments comprise two or more cooling coils. Some embodiments comprise coils with substantially the same capacity and some embodiments comprise coils with differing capacities.

Final cooling coil 1025 attaches to a final cooling coil cold-water inlet pipe 1040. As shown in FIG. 1 through FIG. 7, a final cooling water flow control valve 1035 also attaches to final cooling coil cold-water inlet pipe 1040, as well. Final cooling coil 1025 also connects to final cooling coil water outlet pipe 1045. ISECS 1010 serving dedicated individual server rack enclosures 1015 connect to secondary cooling loops fed by a MECS or by traditional water chillers that provide cold water to one or more ISECS 1010. One pump provides cold water to the pre-cooling coils 1070 of one or more ISECS 1010, while another one provides cold water to the final cooling coils 1025 of at least one ISECS 1010. Together with various sensors, controllers, and command-and-control hardware or software, final cooling water flow control valve 1035 allows control over cold-water flow through final cooling coil 1025. Together with various sensors, controllers, and command-and-control hardware and/or software, pre-cooling coil water flow control valve 1060 allows control over cold-water flow through pre-cooling coil 1070 to meet the cooling demand in real time. Cooling water enters pre-cooling coil 1070 through pre-cooling coil cold water supply pipe and leaves through pre-cooling coil water outlet pipe 1050.

The hot air inlet 1076 to ISECS 1010 may attach to a standard server rack enclosure 1015 through hot air duct elbow 1077. The air exits through a standard, perforated, cold air discharge grill 1017 supplying cooled air back into the IT Room in the embodiment depicted in FIG. 1-FIG. 5, for example.

In some embodiments the transition from the bottom of server rack enclosure 1015 into housing 1075 up to at least a final cooling coil 1025 is thermally insulated to keep heat from the server from escaping into the region beneath the raised floor or in the basement or crawl space beneath server rack enclosure 1015. In some embodiments, a thermally insulated hot air duct elbow 1077 extends from the housing 1075 up into server rack enclosure 1015 to help direct hot air from the servers or other equipment into ISECS 1010.

Fans suitable for use in ISECS 1010 include any type of fan useful in the HVAC arts. Some embodiments use variable speed fans in one or more positions within ISECS 1010. The fans can be powered by any type of motor used in HVAC arts such as hydraulic, pneumatic, or later developed motors adapted for use in that industry. Some invention fans are powered with energy-efficient motors. Invention fans can be fixed or variable speed. For purposes of this invention, "fan" encompasses any device designed to move air, such as air within an HVAC system. In addition to other air-moving devices, "fan" includes fans, blowers, etc.

Cooling coils useful in invention embodiments include any type of air-to-water heat exchanger useful in the HVAC arts. The coils are supplied with cold water using a system that comprises a water cooling system, comprising at least one shutoff valve. In some embodiments, the shutoff valve is combined with variable flow control. The water cooling system can be any cooling system as used in HVAC arts or other arts encompassing chilled water. Variable flow, shutoff valves can be remotely controlled in some embodiments. In some embodiments, at least some cooling load is serviced by a MECS as described below. In some embodiments greater than 25 percent, 50 percent, 75 percent, or 99 percent of the cooling is supplied by a MECS, as described below.

Real Time Monitoring and Control System

Command-and-control systems, units, or devices such as a real time Data Center cooling systems employing real time monitoring and control systems comprise programmable logic controllers (PLC), field programmable gate arrays, or programmable controllers that are or that function as digital computers. In some invention embodiments, the digital computer is configured for use in the automation of electromechanical processes. In addition to programmable controllers or alternatively to programmable controllers, some command-and-control devices comprise computer-, microprocessor-, microcontroller-, programmable-logic-device-, or analog-based control systems. Generally, these are all referred to as computers or as computer-based.

A digital computer configured for use in the automation of electromechanical processes comprises at least one sensor. These or other embodiments comprise at least one controller. One or more sensors monitor a cooling parameter. A cooling parameter is any of the following: air and water temperature; air and water flows, differential air and water pressures, air humidity; electric power consumption (loads) of racks, servers, power distribution units, uninterruptable power supplies, lighting, transformers and switchgear, pumps, fans, motors or combinations of these. The controllers control at least one of air and water flow in real time to automatically adjusts water temperature and flow, air temperature and flow, and motor and fan speeds to meet the immediate electric power consumption (loads) of each individual server rack enclosure or the immediate cooling needs of the space or both.

Real Time Data Center Cooling System

Real Time Data Center Cooling Systems employing MECS generate cold water to cool individual server rack enclosures for a Data Center have capital expenditure first costs and startup costs within about ±50% of the costs of traditional mechanical refrigeration systems. In some embodiments, the overall system uses no HVAC-type refrigeration compressors and no halogenated refrigerant chemicals, such as freons.

Operation

For embodiments similar to those of FIG. 1, FIG. 2, FIG. 5, and FIG. 7, in which cooling fan 1020 sits downstream of final cooling coil 1025 and/or pre-cooling coil 1070, the operation is as follows. In the operation of local cooling systems ISECS 1010, one or more fans 1020 composing fan rack 1024 move hot air from server rack enclosure 1015 across one or more final cooling coil 1025 and/or pre-cooling coil 1070, dropping the temperature of the hot air to a target exhaust temperature before returning the cooled air to the room. This air movement facilitates room air to enter server rack enclosure 1015. Once inside server rack enclosure 1015, the entering room air stream cools the servers in server rack enclosure 1015 becoming hot in the process. Operation of cooling system fans 1020 causes air to move through server rack enclosure 1015 and pick up heat from the servers. This air continues through housing 1075 where it passes over final cooling coil 1025 and/or pre-cooling coil 1070 and transfers heat to the cooling water. Finally, the cooled air passes fan 1020 and exits cooling unit housing 1075, returning to the room. The air coming out of ISECS 1010 pressures the total under-floor space. The pressure causes the return air to be discharged through perforated tiles or cold air discharge grill 1017.

In embodiments similar to FIG. 3, FIG. 4, and FIG. 6, since fan 1020 pushes air through ISECS 1010, cooled air exits cooling unit housing 1075 without passing fan 1020.

Any number of sensors as described above sense the power usage of the servers, power supplies, or other equipment within server rack enclosure 1015, as discussed above. Sensors can also monitor air temperature and other conditions and parameters of the air. The command-and-control system receives signals from one or more sensors and applies special algorithms to adjust one or more controllers so that an appropriate amount of cooling is accomplished. The amount of cooling is commensurate with the cooling needs of the individual server rack enclosures 1015.

In some embodiments, the command-and-control system adjusts airflow through ISECS 1010 to adjust the amount of cooling. Airflow adjustments come from adjusting fan 1020 speed. In these or other embodiments, the command-and-control system adjusts the flow rate of cooling water through final cooling coil 1025 and/or pre-cooling coil 1070 to adjust the amount of cooling. Cooling water flow rate can be adjusted by adjusting water flow control valves, either 1035 and/or 1060, for each individual local cooling system and adjusting speeds of the main pumps serving the secondary cooling water loops as well as in some embodiments adjusting accordingly cooling capacity of cooling water loops. In some embodiments, environmental air conditioning for the data center is provided by cooling coils serviced with cold water from a MECS, as defined in this document.

In some embodiments, ISECS use less than 0.93, 0.9, 0.85, 0.82, 0.80, 0.78, 0.75, 0.73, 0.70, 0.69, or 0.69 kilowatts of energy to provide one ton of cooling.

TABLE 3

Real Time Data Center Cooling System Energy and GHG (Carbon Footprint) Savings Comparing Various Data Center Cooling System Energy Usage in KW/Ton. KW/Ton data from Rittal White Paper 507: Understanding Data Center Cooling Energy Usage & Reduction Methods by Daniel Kennedy. White Paper 507 uses the annual average temperature of six major US cities, whereas, the Real Time Data Center Cooling System uses a Worst Case Scenario - Phoenix Summer Design Conditions for Average Data Center

| | Condenser Fan/Cooling Tower | Compressor | Evaporator Fan | Chilled Water Pump | Refrigerant Pump | Pumped Refrig Fan | Humidification | Liquid Cooled Svr Pump | Server Fans | Total KW/Ton |
|---|---|---|---|---|---|---|---|---|---|---|
| CRAC Cooled System | 0.24 | 1.29 | 0.51 | | | | 0.58 | | 0.26 | 2.88 |
| CRAH Cooled Systems - Chilled Water Based | 0.16 | 1.12 | 0.51 | 0.10 | | | 0.58 | | 0.26 | 2.73 |
| CRAC Cooled System w Containment | 0.21 | 1.25 | 0.45 | | | | 0.50 | | 0.26 | 2.67 |
| CRAH Cooled System w Containment | 0.15 | 1.08 | 0.45 | 0.10 | | | 0.50 | | 0.26 | 2.54 |
| Liquid Cooled Racks Unoptimized | 0.15 | 1.08 | 0.28 | 0.10 | | | 0.50 | | 0.26 | 2.37 |
| Liquid Cooled Racks Chilled Water Temperatures Optimized | 0.13 | 0.96 | 0.28 | 0.09 | | | | | 0.26 | 1.72 |
| Liquid Cooled Racks Chilled Water Temperatures Optimized and Free Cooling Systems | 0.13 | 0.63 | 0.28 | 0.09 | | | | | 0.26 | 1.39 |
| Liquid Cooled Racks Chilled Water Temperatures Optimized and Evaporative Free Cooling Systems | 0.22 | 0.36 | 0.28 | 0.09 | | | | | 0.26 | 1.21 |
| Active Liquid Cooled Doors, Chilled Water Temp Optimized, & Evaporative Free Cooling Systems | 0.22 | 0.36 | 0.24 | 0.09 | | | | | 0.26 | 1.17 |
| Passive Liquid Cooled Doors Chilled Water Temp Optimized & Evaporative Free Cooling Systems | 0.22 | 0.36 | | 0.09 | | | | | 0.26 | 0.93 |
| Pumped Refrigerant Systems | 0.16 | 1.12 | | 0.10 | 0.04 | 0.06 | | 0.26 | 1.74 | |
| Air Side Economizing | 0.05 | 0.37 | 0.51 | 0.03 | | | 0.19 | | 0.26 | 1.41 |

Natural Cycle Energy Inc.

Note 1: Rittal Corporation White Paper Data—The impact of these energy sayings is dependent on the installation location because of the variances in ambient outdoor temperatures in different parts of the world. The average annual hourly energy usage analysis figures for six major cities (New York, Chicago, San Francisco, Phoenix, Miami, and Atlanta) were used in developing this analysis and KW/Ton calculations. Overall, these cities average approximately 2,856 hours of free cooling, or 33% of the year. The summer design cooling criteria for each city was not used, only the annual averages.

Note 2: Natural Cycle Energy, Inc. data and analysis for determining energy usage of the Real Time Data Center Cooling System (RTDCCS), which incorporates the Multistage Evaporative Cooling System (MECS) and the Individual Server Enclosure Cooling System (ISECS), is based on ASHRAE summer design conditions for cooling applications in Phoenix Ariz. at 0.4% Occurrence i.e. 110.2° F. DB and 70° F. WB. Therefore, it can be assumed the KW/Ton for the RTDCCS is higher than it would be if using the same six city averages used in the Rittal White.

TABLE 4

KW per Ton Analysis Comparing Various Data Center Cooling Methods vs. Real Time Data Center Cooling System

| Multistage Evaporative Cooling System (MECS) | Total kW/Ton | |
|---|---|---|
| Cooling towers all with fans, pumps, etc. | 0.29 | See Note 2, above. |

| Individual Server Enclosure Cooling System (ISECS) | | |
|---|---|---|
| Rack Fan Coil Unit | 0.14 | See Note 2, above. |
| Server Fans | 0.26 | |

| Total Real Time Data Center Cooling System | KW per Ton |
|---|---|
| | 0.69 |

TABLE 5

Natural Cycle Energy, Inc.
Energy Usage Comparison of Traditional Data Center Cooling Systems to the Natural Cycle Energy, Inc. RTDCCS

| | Traditional Mechanical Cooling KW/Ton | RTDCCS | KW/Ton Savings | % Energy Savings |
|---|---|---|---|---|
| CRAC Cooled System | 2.88 | 0.69 | 2.19 | 76.0% |
| CRAH Cooled Systems - Chilled Water Based | 2.73 | 0.69 | 2.04 | 74.7% |
| CRAC Cooled System w Containment | 2.67 | 0.69 | 1.98 | 74.2% |
| CRAH Cooled System w Containment | 2.54 | 0.69 | 1.85 | 72.8% |
| Liquid Cooled Racks Unoptimized | 2.37 | 0.69 | 1.68 | 70.9% |
| Liquid Cooled Racks Chilled Water Temperatures Optimized | 1.72 | 0.69 | 1.03 | 59.9% |
| Liquid Cooled Racks Chilled Water Temperatures Optimized and Free Cooling Systems | 1.39 | 0.69 | 0.70 | 50.4% |
| Liquid Cooled Racks Chilled Water Temperatures Optimized and Evaporative Free Cooling Systems | 1.21 | 0.69 | 0.52 | 43.0% |
| Active Liquid Cooled Doors, Chilled Water Temp Optimized, & Evaporative Free Cooling Systems | 1.17 | 0.69 | 0.48 | 41.0% |
| Passive Liquid Cooled Doors Chilled Water Temp Optimized & Evaporative Free Cooling Systems | 0.93 | 0.69 | 0.24 | 25.8% |
| Pumped Refrigerant Systems | 1.74 | 0.69 | 1.05 | 60.3% |
| Air Side Economizing | 1.41 | 0.69 | 0.72 | 51.1% |

TABLE 6

Energy Usage and Savings Comparison of Traditional Data Center Cooling Systems to the RTDCCS Annual Cooling Energy Cost Calculation

| | |
|---|---|
| Electric Energy Unit Cost USD per kWh | 0.10 |
| kW of IT Load | 2000 |
| Tons of Cooling Required | 569 |

| | Energy Usage KW/ton | | | | Annual Energy Cost | | |
|---|---|---|---|---|---|---|---|
| | Traditional Mech. Cooling KW/Ton | RTDCCS KW/Ton | KW/Ton Savings | % Energy Savings | Trad'l Mech. Cooling $/Year | RTDCCS Cooling $/Year | $ Savings |
| CRAC Cooled System | 2.88 | 0.69 | 2.19 | 76.0% | $1,434,101 | $343,926 | ($1,090,175) |
| RAH Cooled System - Chilled Water Based | 2.73 | 0.69 | 2.04 | 74.7% | $1,350,885 | $343,926 | ($1,006,959) |
| CRAC Cooled System w/ Containment | 2.67 | 0.69 | 1.98 | 74.2% | $1,331,452 | $343,926 | ($987,525) |
| CRAH Cooled System w/ Containment | 2.54 | 0.69 | 1.85 | 72.8% | $1,262,413 | $343,926 | ($918,486) |
| Liquid Cooled Racks Unoptimized | 2.37 | 0.69 | 1.68 | 70.9% | $1,179,695 | $343,926 | ($835,769) |
| Liquid Cooled Racks Chilled Water Temperature Optimized | 1.72 | 0.69 | 1.03 | 59.9% | $857,072 | $343,926 | ($513,146) |
| Liquid Cooled Racks Chilled Water Temperature Optimized and Evaporative Free cooling Systems | 1.21 | 0.69 | 0.52 | 43.0% | $600,548 | $343,926 | ($256,622) |

TABLE 6-continued

Energy Usage and Savings Comparison of Traditional Data Center Cooling Systems to the RTDCCS

| | | | | | | | |
|---|---|---|---|---|---|---|---|
| Active Liquid Cooled Doors, Chilled Water Temperature Optimized and Evaporative Free cooling Systems | 1.17 | 0.69 | 0.48 | 41.0% | $583,008 | $343,926 | ($239,082) |
| Passive Liquid Cooled Doors, Chilled Water Temperature Optimized and Evaporative Free cooling Systems | 0.93 | 0.69 | 0.24 | 25.8% | $463,417 | $343,926 | ($119,490) |
| Liquid Cooled Racks Chilled Water Temperature optimized and Free Cooling Systems | 1.39 | 0.69 | 0.70 | 50.4% | $694,428 | $343,926 | ($350,501) |
| Pumped Refrigerant Systems | 1.74 | 0.69 | 1.05 | 60.3% | $865,543 | $343,926 | ($521,617) |
| Air Side Economizing | 1.41 | 0.69 | 0.72 | 51.1% | $705,988 | $343,926 | ($362,062) |

Multistage Evaporative Cooling System (MECS)

The MECS's new methods and systems allows the generation of cold makeup or process and/or comfort cooling supply air or cold cooling fluid, such as water, at a low temperature, meeting the conditioned space's temperature control requirements without adding moisture to the supply air in most cases.

Main Features of the MECS are:

Design Simplicity (MECS does not need to rely on any high-energy-using refrigeration compressors).

Ecologically sound design (MECS uses only water and atmospheric air-no need to use Freon-type refrigerants such as hydrochlorofluorocarbons (HCFCs)).

Scalability (MECS can be scaled to provide as little as 5 tons to well over 500 tons of equivalent Conventional Mechanical Refrigeration Cooling).

Economical Energy Use (MECS has significantly lower power consumption compared to Conventional Mechanical Refrigeration Systems).

Green Electrical Energy Use (MECS can use green electrical energy sources (solar, wind, etc.).

Figure 10:
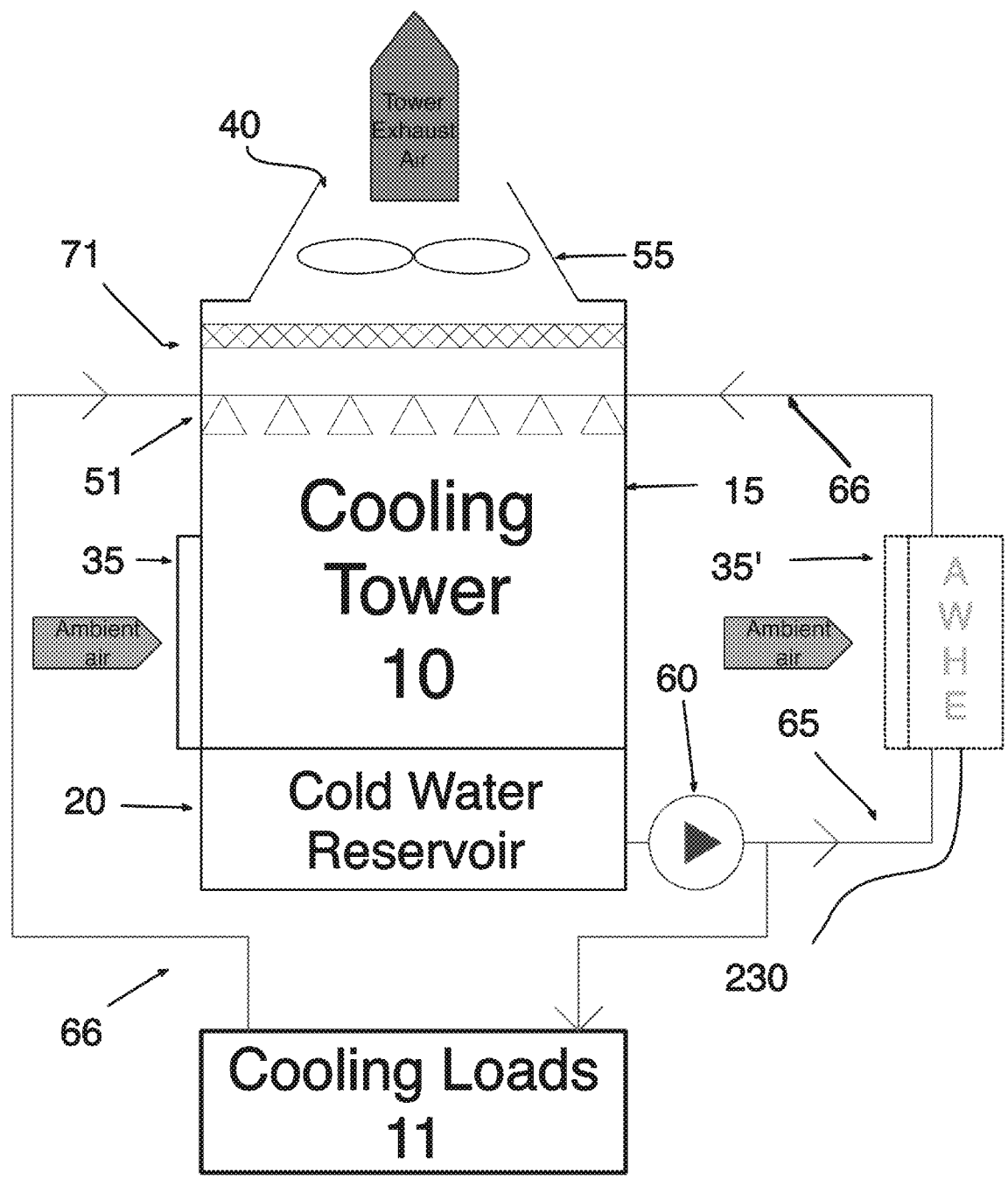
FIG. 10 depicts a cooling tower useful in cooling system embodiments.

FIG. 10 shows cooling tower 10, a Type-I cooling tower. Cooling tower 10 comprises tower casing 15, cold-water reservoir 20, air inlet 35, air outlet 40, water distribution system with nozzles 51, fan 55, pump 60, cold-water outlet 65, warm or spent water inlet 66, and mist eliminator 71. Fan 55 is not present in some examples. Air inlet 35 sits near the bottom of cooling tower 10 in the embodiment depicted FIG. 10. Other examples can be envisioned in which air inlet 35 sits remotely from cooling tower 10, but in those examples, ambient air should enter cooling tower 10 below air outlet 40. Cold-water reservoir 20 sits near the bottom of cooling tower 10. But other examples exist in which cold-water reservoir 20 sits remotely from cooling tower 10. In those types of examples, one of ordinary skill in the art would recognize that additional piping and plumbing would be useful in such examples.

In some examples, airflow through cooling tower 10 is assisted by fan 55. Fan 55 sits near the uppermost part of cooling tower 10 near air outlet 40. Fan 55 may either be located downstream of mist eliminator 71 or upstream of mist eliminator 71. Alternatively, a fan may mount at the inlet of cooling tower 10, pushing ambient air through cooling tower 10. Of course, a cooling tower could use two or more fans.

In some examples, water is distributed by the water distribution system with nozzles 51 over a mass heat transfer media (fill). In these types of examples, one of ordinary skill in the art would recognize that mass heat transfer occurs through the interaction between the water and air on the surface of the fill.

As stated previously, FIG. 10 depicts fan 55 on the top of cooling tower 10. Mist eliminator 71 sits near the top of cooling tower 10 in the embodiment depicted in FIG. 10, as will be the case in most examples that employ a counter flow design. Some examples may use a cross flow cooling tower design, which would lead to a different arrangement of air inlets, water distribution systems, fans, etc. Water distribution system with nozzles 51 attaches to warm or spent water inlet 66, which connects between cooling load 11 at the warm outlet of air-to-water heat exchanger 230 and water distribution system with nozzles 51. Pump 60 connects to cold-water reservoir 20 and connects to cooling loads 11 and an external air-to-water heat exchanger, such as air-to-water heat exchanger 230, through cold-water outlet 65. Cold-water outlet 65 also connects to the cold-water inlet of air-to-water heat exchanger 230.

Invention cooling systems use a variety of cooling towers in addition to cooling tower 10.

Figure 11:
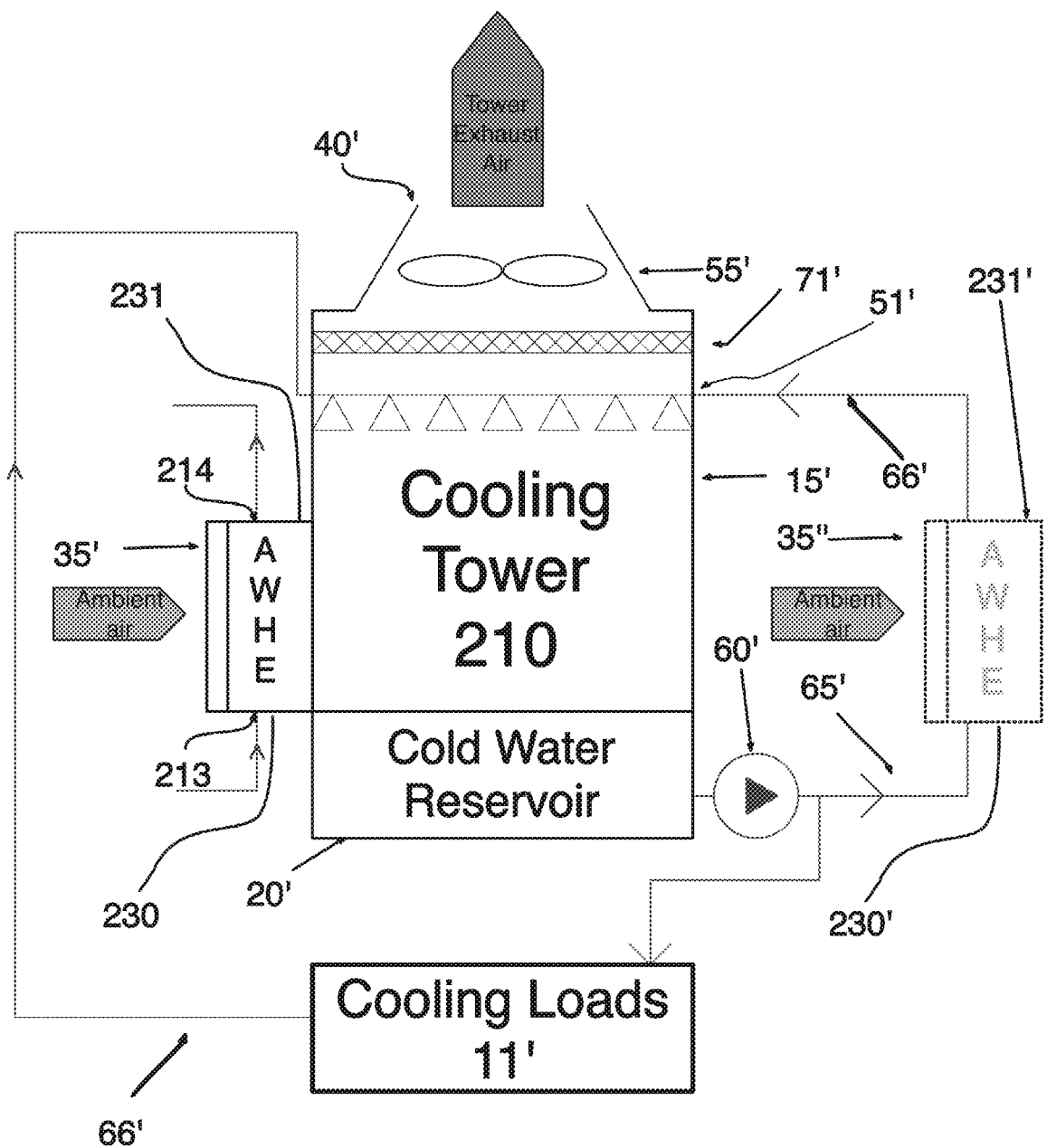
FIG. 11 depicts another useful cooling tower further comprising an air-to-water heat exchanger or an air pre-cooling heat exchanger.

FIG. 11 shows another type of cooling tower used in invention cooling systems—cooling tower 210, a Type-II cooling tower. Cooling tower 210 comprises tower casing 15', cold-water reservoir 20', air inlet 35', air outlet 40', water distribution system with nozzles 51', fan 55', pump 60', cold water outlet 65', warm water inlet 66', mist eliminator 71', and air-to-water heat exchanger 230.

Air-to-water heat exchanger 230 comprises a housing 231, heat exchanger cold-water inlet 213, and heat exchanger warm water outlet 214. In some examples, cold-water inlet 213 connects to cold-water outlet 65 and heat exchanger warm water outlet 214 connects to warm water inlet 66 of a Type-I cooling tower. In other examples, cold-water inlet 213 connects to cold-water outlet 65' and heat exchanger warm water outlet 214 connects to warm water inlet 66' of a Type-II cooling tower.

Air inlet 35' sits near the bottom of cooling tower 210, in the embodiment depicted by FIG. 11. Other examples exist in which air inlet 35' sits remotely from cooling tower 210 as long as ambient air enters cooling tower 210 below air outlet 40'. Air-to-water heat exchanger 230 sits between air inlet 35' and cooling tower 210. Cold-water reservoir 20' sits near the bottom of cooling tower 210. But other examples exist in which cold-water reservoir 20' sits remotely from cooling tower 210. In those types of examples, one of ordinary skill in the art would recognize that additional piping and plumbing would be useful.

In some examples, fan 55' assists air in flowing through cooling tower 210. Fan 55' sits on the top of cooling tower 210 near air outlet 40'. Fan 55' may sit either downstream of mist eliminator 71' or upstream of mist eliminator 71'. Alternatively, a fan mounts at the inlet of cooling tower 210, designed to push ambient air through cooling tower 210. Of course, this cooling tower may use two or more fans.

In some examples, water is distributed by the water distribution system with nozzles 51 over a mass heat transfer media (fill). In these types of examples, one of ordinary skill in the art would recognize the mass heat transfer interaction between the water and air on the surface of the fill.

Pump 60' is in fluid communication with cold-water reservoir 20' and in fluid communication with water distribution system with nozzles 51', which is located near the uppermost part of cooling tower 210. In some examples, "fluid communication" encompasses a cold-water outlet 65' connected to pump 60'. Cold-water outlet 65' connects through an external device, comprising a pipe, heat exchanger, or other external device (such as cooling load 11'), to warm water inlet 66'. In these or other examples, pump 60' connects to cold-water reservoir 20' and connects to cooling loads 11' and an external air-to-water heat exchanger, such as air-to-water heat exchanger 230', through cold-water outlet 65'. Warm water inlet 66' connects to water distribution system with nozzles 51'. In some examples, cold-water outlet 65' connects to an external device such as an air-to-water heat exchanger mounted upon another or an adjacent cooling tower or a cooling tower of another cooling stage, and then continues on to water distribution system with nozzles 51' through warm water inlet 66'.

In some examples, pump 60' services water distribution system with nozzles 51'. In these or other examples, pump 60' or another pump pumps cold water from cold-water reservoir 20' to the cold-water inlet on an air-to-water heat exchanger mounted on another cooling tower and another pump pumps water-to-water distribution system with nozzles 51'.

Figure 12:
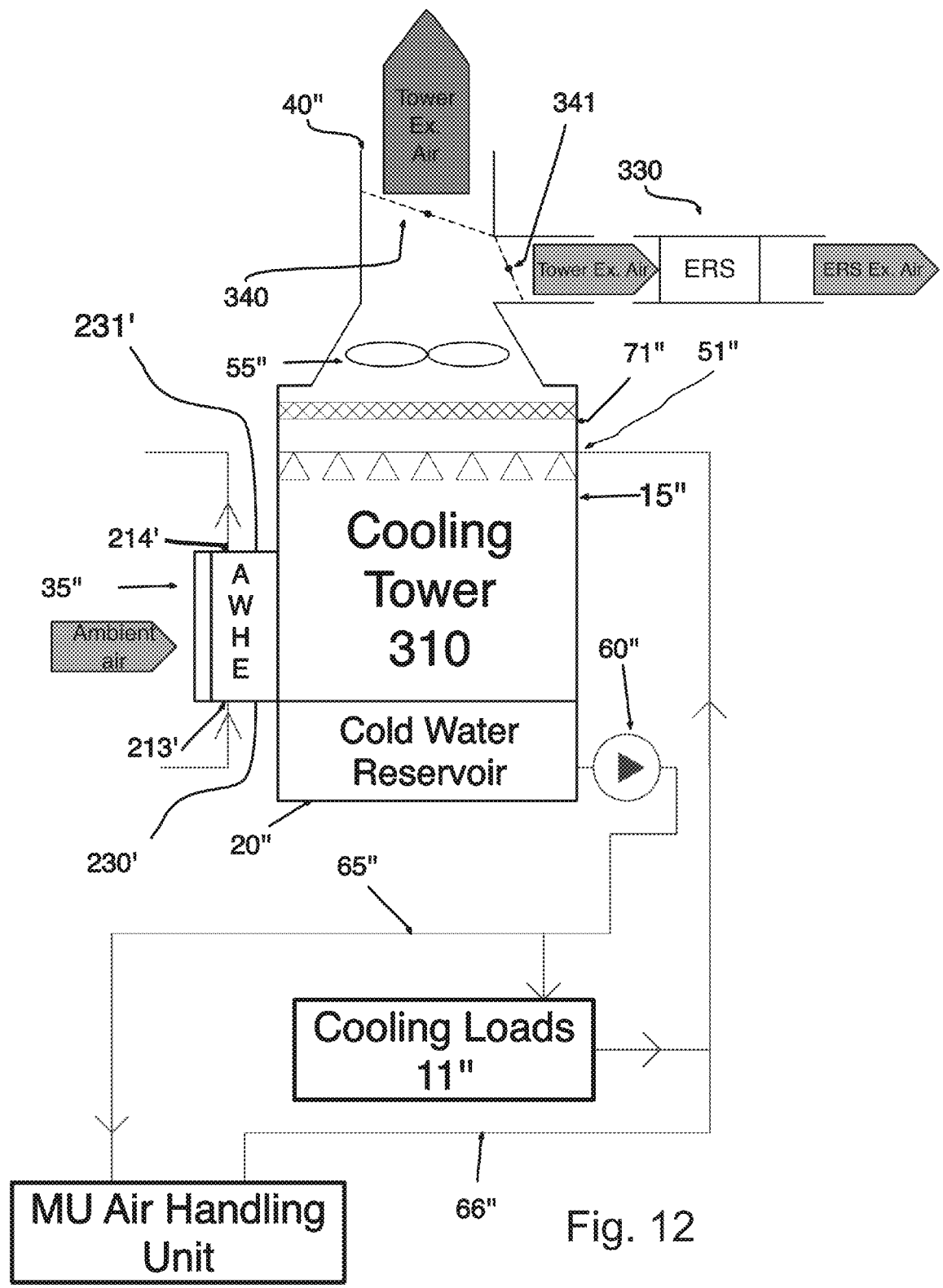
FIG. 12 depicts another useful cooling tower further comprising an energy recovery system.

FIG. 12 shows another type of cooling tower for use in invention cooling systems—Cooling tower 310, a Type-III cooling tower. Cooling tower 310 comprises tower casing 15", cold-water reservoir 20", air inlet 35", air outlet 40", water distribution system with nozzles 51", fan 55", pump 60", pipe 65", mist eliminator 71", air-to-water heat exchanger 230', and energy recovery system 330.

Air-to-water heat exchanger 230' comprises a housing 231', cold-water inlet 213', and heat exchanger warm water outlet 214'.

Air inlet 35" sits near the bottom of cooling tower 310 in the embodiment depicted by FIG. 12. Other examples exist in which air inlet 35" sits remotely from cooling tower 310 as long as ambient air enters cooling tower 310 below air outlet 40". Air-to-water heat exchanger 230' sits between air inlet 35" and cooling tower 310. Cold-water reservoir 20" sits near the bottom of cooling tower 310. But other examples exist in which cold-water reservoir 20" sits remotely from cooling tower 310. In those types of examples, one of ordinary skill in the art would recognize that additional piping and plumbing would be useful in such examples. As in cooling tower 210, various examples exist in which cold-water reservoir 20 and cold-water reservoir 20' are located remotely from cooling tower 10 and cooling tower 210, respectively.

In some examples, fan 55" assists air in flowing through cooling tower 310. Fan 55" sits on the top of cooling tower 310 near air outlet 40". Fan 55" may sit downstream of mist eliminator 71" or upstream of mist eliminator 71". Alternatively, a fan mounts at the inlet of cooling tower 310, designed to push ambient air through cooling tower 310. Of course, a cooling tower may use two or more fans.

In some examples, water is distributed by the water distribution system with nozzles 51" over a mass heat transfer media (fill). In these types of examples, one of ordinary skill in the art would recognize that the mass heat transfer interaction between the water and air on the surface of the fill.

Pump 60" is in fluid communication with cold-water reservoir 20" and in fluid communication with water distribution system with nozzles 51" located near the uppermost part of cooling tower 310. In some examples, fluid communication encompasses a pipe 65", connected between pump 60" and water distribution system with nozzles 51".

In some examples, pump 60" services water distribution system with nozzles 51". In these or other examples, pump 60" or another pump pumps cold water from cold-water reservoir 20" to a cooling load (such as cooling loads 11" or a makeup air handling unit 715). Invention examples may cool any suitable cooling load (cooling loads 11"). Suitable cooling loads can be virtually any cooling load and include the following cool loads: environmental cooling (HVAC), building comfort cooling, process cooling, individual server enclosure/rack cooling, or any electronics enclosure generating a heat load. In some examples, the cooling load is a make-up air-handling unit (MU Air Handling Unit or MUAHU). In some examples, any cooling load that can be cooled with one or more cooling coils is suitable for this invention.

Figure 17:
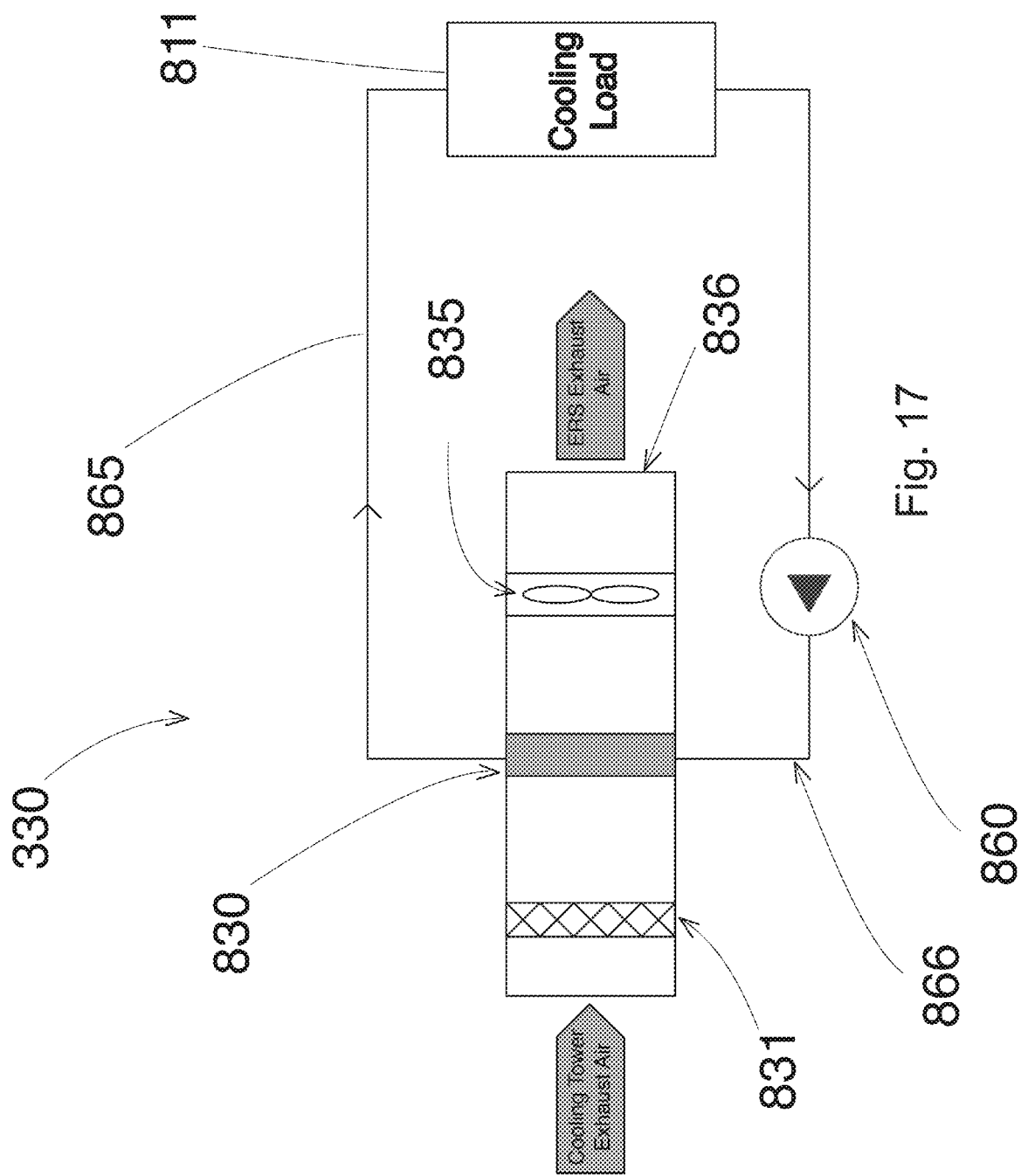
FIG. 17 depicts an energy recovery system.

In some examples, such as the embodiment depicted in FIG. 17, energy recovery systems, such as energy recovery systems (ERS) 330 comprise a water circulation system comprising a pump 860 and an air-to-water heat exchanger 830. A particulate filter 831 sits upstream of air-to-water heat exchanger 830, between an associated cooling tower and air-to-water heat exchanger 830. After air-to-water heat exchanger 830 comes fan 835 and finally outlet 836 to ambient air. ERS 330 connects to any suitable cooling load 811 through a closed-loop water circulation system. The water circulation system comprises air-to-water heat exchanger 830, warm water inlet pipe 866, pump 860, cooling load 811, and cold-water outlet pipe 865. Beginning with air-to-water heat exchanger 830, cold-water outlet pipe 865 connects to the output of air-to-water heat exchanger 830 and connects to the cold-water inlet of cooling load 811. The warm water outlet of cooling load 811 connects to pump 860. Pump 860 connects to warm water inlet pipe 866, which in turn connects to the warm water inlet of air-to-water heat exchanger 830. ERS 330 recovers "coolness" from the exhaust stream of an associated cooling tower. Since this is a closed loop system, the water can be any suitable heat transfer fluid including a water and glycol mixture.

In some examples, energy recovery system 330 operates in conjunction with dampers 340, 341 in an associated cooling tower. Damper 340 sits in the air outlet pathway and damper 341 sits in the ERS air pathway. Both are disposed to allow the airflow to be adjusted from 100% through air outlet 40" and 0% through ERS 330, 0% air outlet 40" to 100% through ERS 330, or any air mixture or combination of mixtures. Any of the cooling tower examples described in this document may additionally comprise an energy recovery system located at the air outlet of the cooling tower.

In any of the cooling tower types, one or more pumps may be variable speed pumps or fixed speed pumps. In any of the cooling tower types, one or more fans may be fixed speed fans or variable speed fans.

In addition to the components discussed above, the cooling towers comprise monitoring and command-and-control hardware and optionally software, to monitor and control the operation of the cooling towers. Various types of monitoring and command-and-control hardware and software are familiar to those of ordinary skill in the art. For instance, variable speed fans have command-and-control hardware and software that operate to vary the speed of fans to control airflow through the cooling towers. Variable speed pumps have command-and-control hardware and software to control the flow rate of cold water from cold-water reservoir through the various other components of the cooling tower and to cooling loads. Control over such components is based on the cooling needs of the cooling load, outside temperatures, etc. Control is exercised in some examples to run only necessary fans, pumps, etc. to meet the necessary cooling load without wasting energy. One category of energy that is saved because of the intervening command and control systems, is energy normally wasted by operating fans, pumps, etc. faster or at a higher capacity than necessary to satisfy the cooling load demands on the cooling system. In some examples, components of the MECS are operated by a dedicated control system communicating with a building energy management system. The control software of the control system optimizes the operation of the cooling system components to meet variable or constant conditioned space cooling loads, process-cooling loads, or other cooling loads at the absolute lowest or minimum amount of energy consumption.

Figure 13:
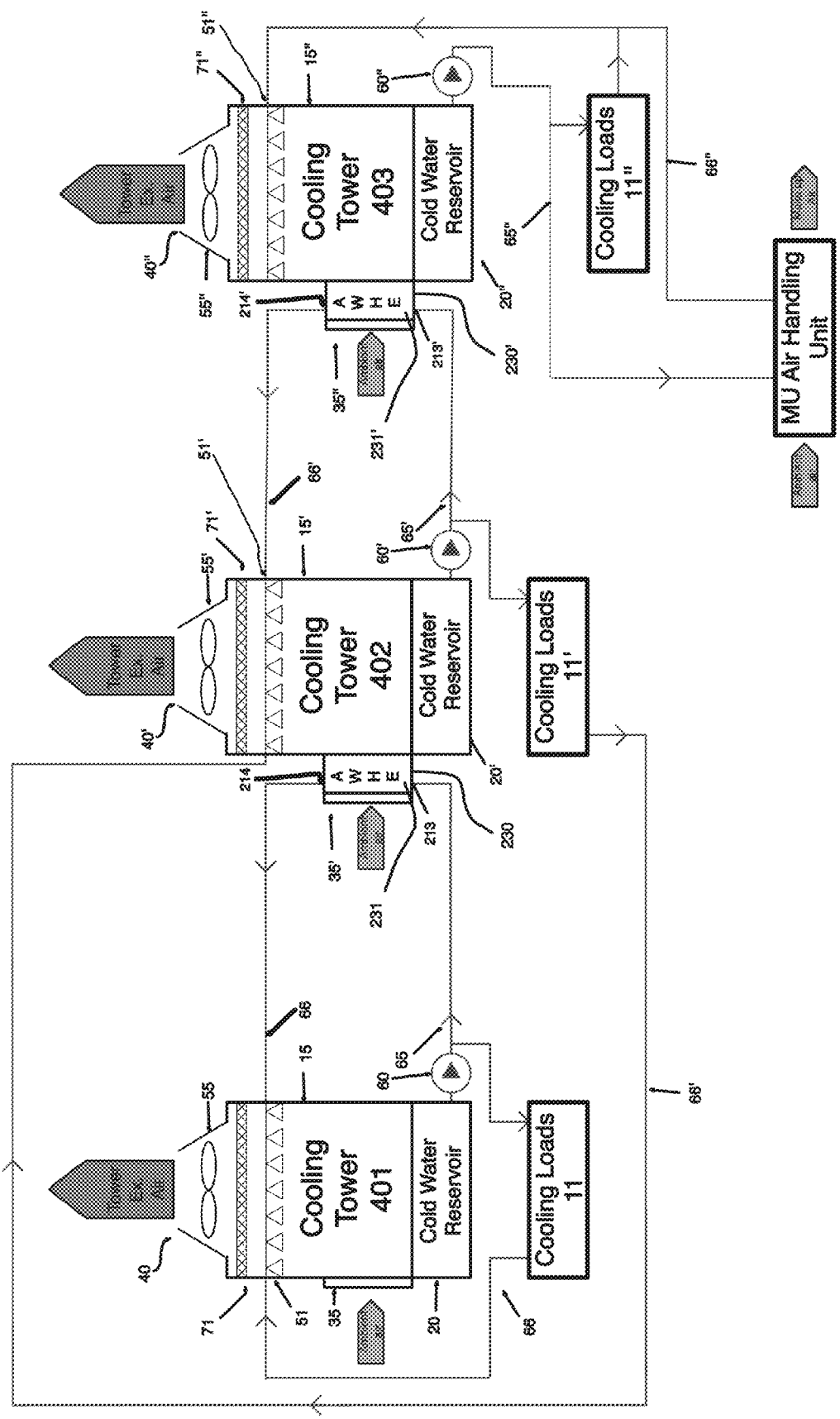
FIG. 13 depicts a cooling system embodiment.

FIG. 13 depicts an embodiment of an invention cooling system. Cooling system 400 comprises three cooling towers: a Type-I cooling tower, cooling tower 401; a Type-II cooling tower, cooling tower 402; and a Type-III cooling tower, cooling tower 403. Cold-water reservoir 20 of cooling tower 401 connects through cold-water outlet 65 to cold-water inlet 213, which connects to air-to-water heat exchanger 230 of cooling tower 402. Air-to-water heat exchanger 230 of cooling tower 402 connects through heat exchanger warm water outlet 214 to warm water inlet 66, which returns warm water to cooling tower 401, as shown in the figure. In some examples, warm water returns to the water distribution system with nozzles 51 of cooling tower 401.

Cold-water reservoir 20' of cooling tower 402 connects through cold-water outlet 65' to cold-water inlet 213' of air-to-water heat exchanger 230' of cooling tower 403. Air-to-water heat exchanger 230' connects through heat exchanger warm water outlet 214', to warm water inlet 66', which returns warm water to cooling tower 402, as shown in FIG. 13. In some examples, warm water returns to the water distribution system with nozzles 51' of cooling tower 402.

Cold-water reservoir 20" of cooling tower 403 has cold-water outlet 65" that connects to the cold-water inlet of any suitable cooling load 11". Likewise, warm-water returns through warm water inlet 66" that connects to the warm water outlet of cooling load 11" to the water distribution system with nozzles 51" of cooling tower 403.

Cold-water reservoir 20 of cooling tower 401 and cold-water reservoir 20' of cooling tower 402 may connect to optional cold-water supply and warm-water return lines connecting to various different cooling loads 11, 11'. One of ordinary skill in the art would choose which cold-water reservoir (which cooling stage) to use based on the nature of the cooling load. In some examples, the cooling system comprises four or more cooling towers.

Figure 14:
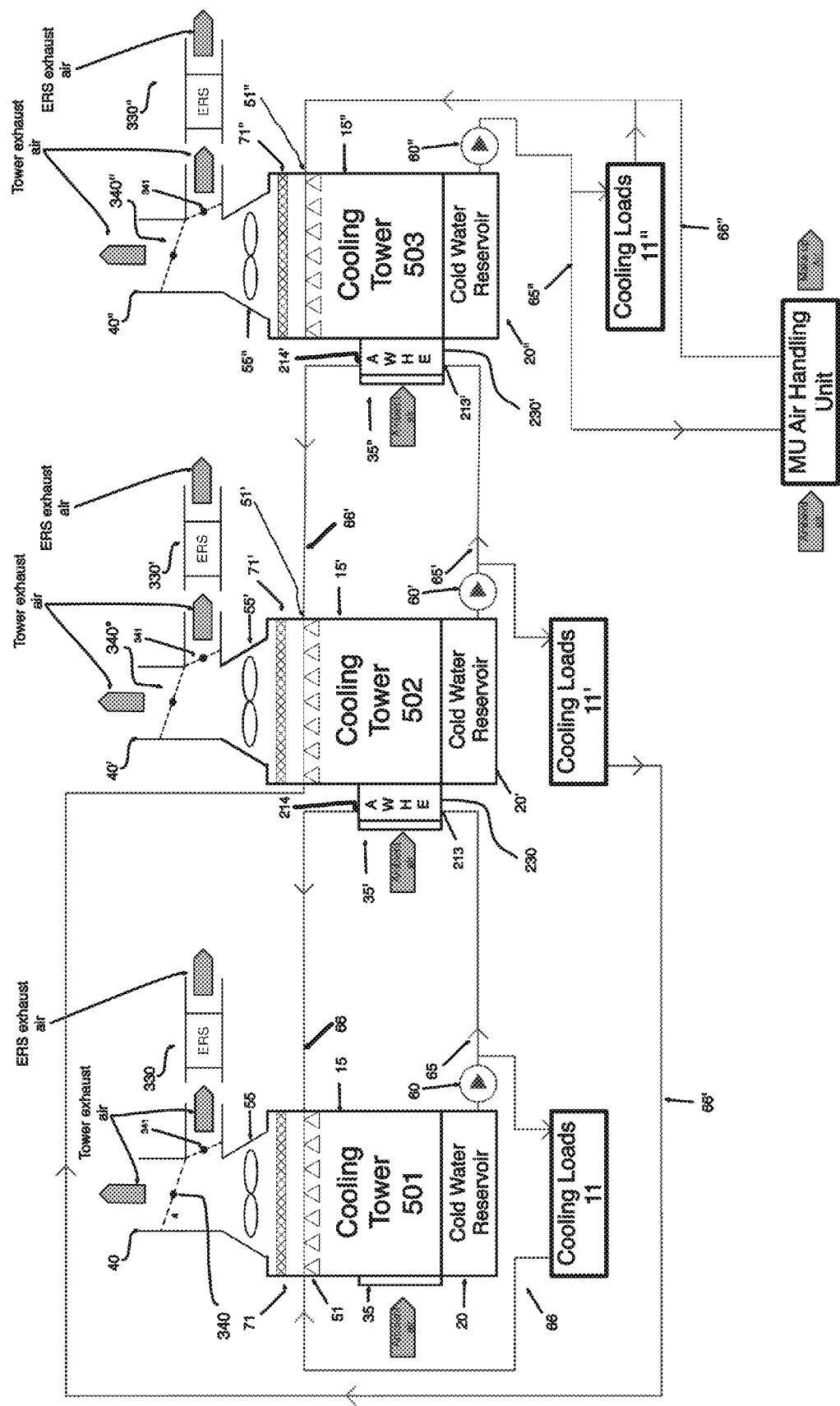
FIG. 14 depicts another cooling system embodiment.

FIG. 14 depicts cooling system 500, which is similar to cooling system 400 of FIG. 13, discussed above. In addition to the components and connectivity discussed for the cooling system above, this cooling system contains at least one energy recovery system 330 wherein the energy recovery system 330 attaches to one or more cooling towers such as cooling towers 501, 502, 503 to recapture the "coolness" of cold air exiting from the cooling tower. In some examples, cooling system 500 comprises a second or third energy recovery system 330, 330' on the second or third cooling towers, such as cooling tower 502 or cooling tower 503. And in some examples, the cooling system comprises four or more cooling stages with an energy recovery system on one or more cooling towers.

One typical, suitable cooling load for a cooling system such as cooling system 400 or 500 is a Make Up Air Handling Unit (MUAHU).

Makeup Air Handling Unit 715 comprises one or more air particulate filters 750 at or near air inlet 720 of MUAHU 715. Following the air path through MUAHU 715 air-to-air heat exchanger 745 is downstream of air inlet 720 and air particulate filters 750. Air-to-air heat exchanger 745 comprises two air paths that do not mix with each other. One of those air paths relates to the makeup air and the other relates to the building exhaust air. Fan 755 pulls building exhaust air through air-to-air heat exchanger 745, and fan 735 pulls make up air through air-to-air heat exchanger 745. An air-to-water heat exchanger 740 comes after air-to-air heat exchanger 745 in MUAHU 715. A variable or fixed speed supply fan 735 is disposed in MUAHU 715 downstream of air-to-air heat exchanger 740. In some examples, a direct evaporative or adiabatic water humidifier (with mist eliminator) 730 sits near air outlet 731 of MUAHU 715, just upstream of nozzles 732. Cold-water outlet 65" transports cold water from a cooling system to the cold-water inlet of air-to-water heat exchanger 740. Warm water inlet 66" transports warm water from the warm water outlet of air-to-water heat exchanger 740 to the cooling system.

In some examples, components of the MECS are operated by a dedicated control system communicating with a building energy management system. The control software of the control system optimizes the operation of the cooling system components to meet variable or constant conditioned space cooling loads, process-cooling loads, or other cooling loads at the absolute lowest or minimum amount of energy consumption. Executing this software, the control system, depending on the conditioned space load, the process cooling load, or some other cooling load and indoor and outdoor air dry bulb and wet bulb temperatures, automatically provides the necessary speed control over cooling towers fans, supply air fans of makeup air-handling units, return and supply air fan, return and supply air humidifiers, etc., and the necessary flow control over the cooling fluids by controlling pumps, which are typical components of commercial, industrial, or other cooling systems. The control system also automatically adjusts all operational components of the MECS to achieve the amount of cooling needed for the load in real time to maximum cooling efficiency.

In some examples, determined by the cooling application and the environmental conditions of the specific geographical area, components of the MECS are rearranged in an order and sequence and properly sized to maximize the generation of cold water for given environments. These cooling applications or any kind of cooling application in commercial real estate buildings, industrial real estate buildings, and government real estate buildings; manufacturing plants; industrial processing plants; food/beverage processing plants and agricultural buildings.

In some examples, an individual electronics enclosure cooling system uses cold water generated by the different stages of the MECS to apply process cooling method to each cooling load in each individual electronics enclosure. In some examples, invention-cooling systems are optimized for providing cold water to individual electronics enclosures or racks, such as server racks to cool the loads. The electronics enclosure is designed to allow space air to be drawn in to cool the electronics equipment inside the enclosure through an air inlet and further pulled through the enclosure to an air outlet exit point. The warm air, which was heated by the electronics within the enclosure, exits the air outlet of the enclosure and enters into an air inlet of one or more fan coils units. There the warm air is cooled by circulating cooling water such as from an invention cooling system, i.e. cold water from different stages of the MECS, before the cooled air is returned to the space from the air outlet of the fan coil unit.

Cooling system examples exist comprising 2-10 2-5, 5, 4, 3, or 2 types of cooling towers or cooling tower cells. Each of these examples comprises 0, 1, or 2 energy recovery system per cooling tower.

Operation of MECS System

Operationally, any cooling tower suitable for use with the cooling systems of the current invention operates as described below. A cooling tower cools incoming ambient air and water from the cold-water reservoir 20. Fan 55 assists in moving air through the cooling tower. Ambient air enters the cooling tower through air inlet 35 and exits the cooling tower at the top through air outlet 40. As the fan pulls air into the cooling tower, water distribution system with nozzles 51 introduces water on top of the fill through water distribution system nozzles 51 causing or allowing contact between the moving ambient air and the falling liquid water within the fill. The cooled falling liquid water is collected in the cold-water reservoir 20 and the saturated cold air exits the cooling tower through air outlet 40.

Pump 60 pumps water from cold-water reservoir 20 through cold-water outlet 65 to a cooling load, such as air-to-water heat exchanger 230. After moving through the cooling load, the now warmer, cold water travels through warm water inlet 66 into water distribution system with nozzles 51 located above the fill of cooling tower 10. Water falling from the top of cooling tower 10 passes by ambient air moving from air inlet 35 at the bottom of cooling tower 10 to air outlet 40 at the top of cooling tower 10. Fan 55 moves air through cooling tower 10.

This air-water interaction causes some water to evaporate. Water evaporation requires energy, in this case, the energy is extracted from the water flowing through the fill, leaving the water at a lower temperature and the air exiting air outlet 40 at DB temperature lower than ambient air temperature. That is, the air-water interaction lowers the temperature of the air as the air passes through the cooling tower. Cold water falls to the bottom of cooling tower 10 and collects in cold-water reservoir 20.

All psychometric parameters of the given air have direct correlation with each other in any kind of cooling apparatus. Knowing the dry bulb temperature, the wet bulb temperature, and the barometric pressure of the air allows the determination of all other parameters of the air such as enthalpy, relative humidity, dew point temperature, absolute moisture content, specific volume, etc. For a particular sample of air, the maximum wet bulb temperature is equal to the dry bulb temperature. Larger differences between the dry bulb temperature and the wet bulb temperature indicate drier air.

One of ordinary skill in the art knows that adiabatic cooling of a particular sample of ambient air equal to or below its wet bulb temperature is not possible. During the adiabatic air cooling process, the air's dry bulb temperature is lowered and its moisture content is increased, however, its wet bulb temperature and enthalpy do not change. This has ramifications in using evaporative cooling towers.

Cold-water reservoir 20 located near the bottom of cooling tower 401 feeds cooling loads 11. The warm water from cooling load 11 connects to warm water inlet 66, and to water distribution system with nozzles 51 of cooling tower 401 completing the cycle. Gravity causes the water to fall through the cooling tower fill back into the cold-water reservoir. During this trip, the water again interacts with the air flowing up through the cooling tower and is in direct contact with the air flowing through the cooling tower. The main result from this air-water contact is that, as before, some amount of the water evaporates in the air flowing up through the cooling tower. And the cycle continues. The difference between the dry bulb temperature and the wet bulb temperature is smaller after passing through the cooling tower. Therefore, one of ordinary skill in the art recognizes that the trip through the cooling tower lowers the temperature of the water.

Each of the multiplicity of invention cooling towers operates in this manner. The temperature of the cold water generated by any cooling tower is dependent on the wet bulb temperature of the air entering the cooling tower. The cooling towers use ambient air during operation. Therefore, the only way of attaining cold water temperatures lower than the wet bulb temperature of the ambient air, is to lower the wet bulb and dry bulb temperatures of the ambient air entering the cooling tower. In other words, sensible pre-cooling of the ambient air entering the cooling tower reduces its wet bulb and dry bulb temperature thereby allowing colder water temperatures to be achieved at each cooling stage.

The Type-II cooling towers and Type-III cooling towers add sensible pre-cooling of the ambient air entering the cooling towers through an air-to-water heat exchanger at their air inlets. These air-to-water heat exchangers, also called pre-cooling heat exchangers sit between their respective air inlet and respective cooling tower. A cold-water reservoir of another stage of the cooling system or of a previous stage of the cooling system provides cold water for the air-to-water heat exchanger. As ambient air passes through the heat exchanger, it cools and water from the cold-water reservoir warms. The water returns to the source cooling tower water distribution system with nozzles 51 continuing the cycle. The source cooling tower ultimately removes the heat gained by the cold water as it passed through the air-to-water heat exchanger.

The ambient air passes through the air-to-water heat exchangers which lowers the wet bulb and dry bulb temperatures of the air entering the Type-II or Type-III cooling towers. Since the wet bulb temperature serves as the lower limit for the temperature of the cold-water in this cooling towers and since the wet bulb temperature of the pre-cooled air is lower than that of the incoming ambient air in a previous cooling stage, the Type-I or Type-III cooling tower produces cold water with a temperature lower than cold water produced by an earlier cooling stage. This ability of a later cooling stage to produce colder water than an earlier cooling stage stems directly from the fact that the sensible pre-cooling of ambient air without exposing it to added moisture simultaneously drops the air's dry bulb and wet bulb temperatures. Dropping the wet bulb temperature of each stage's air entering the cooling towers lowers the temperature of the cold water produced by these stages. Thus, cascading cooling towers allows the cooling system to produce lower temperature cold water in each of the successive stages.

Returning to FIG. 13, the cooling system functions to produce cold water to service cooling loads 11, 11', 11", and the cooling load resulting from MU Air Handling Unit 715. In cooling tower 401, fan 55 operates to pull air ambient air through air inlet 35, through air-to-water heat exchanger 230, through the wet fill, past the water distribution system with nozzles 51, through the mist eliminator 71, up through the fan 55, and finally out air outlet 40. Simultaneously with air moving up through the cooling tower 401, pump 60 pumps cold water from cold-water reservoir 20, through cold water outlet 65, connected to inlet water pipe 213, through air-to-water heat exchanger 230 on cooling tower 402, out air-to-water heat exchanger 230, through outlet water pipe 214 connected to warm water inlet 66, and, completing the cycle, to water distribution system with nozzles 51 of cooling tower 401. Water distribution system with nozzles 51 distributes water evenly across the top of the fill of cooling tower 401. The water falls by gravity through the fill of cooling tower 401 to cold-water reservoir 20. As cold water from cold-water reservoir 20 moves through the system, it provides a source of indirect sensible pre-cooling for air entering cooling tower 402 through air-to-water heat exchanger 230. The warmed water is returned to cooling tower 401 via the water distribution system with nozzles 51.

Fan 55' of cooling tower 402 operates to pull ambient air into cooling tower 402 through air inlet 35', through air-to-water heat exchanger 230, through the wet fill, past the water distribution system with nozzles 51, through the mist eliminator 71, up through fan 55', and finally out air outlet 40' of cooling tower 402. Water from water distribution system with nozzles 51' distributes water evenly across the top of the fill of cooling tower 402. As the water falls by gravity through the fill of cooling tower 402, it interacts with the moving pre-cooled air stream that has been pre-cooled by air-to-water heat exchanger 230. The air-water interaction within cooling tower 402 causes some water to evaporate. This evaporation extracts (heat) energy out of the circulating water stream and transfers this energy to the interacting air stream of cooling tower 402. The cold water obtained by the result of the above air-water interaction is collected in cold-water reservoir 20'. The journey of the cold water begins again as pump 60' pumps water from cold-water reservoir 20' through cold-water outlet 65', to pipe 213' into air-to-water heat exchanger 230', out pipe 214', through warm water inlet 66', into water distribution system with nozzles 51'. Since cooling tower 402 operates with an air stream comprising air with a lower wet bulb temperature and dry bulb temperature (because of the air's trip through air-to-water heat exchanger 230), the achievable temperature of the cold water in cold water reservoir 20' is substantially lower than the temperature that the cold water of cold water reservoir 20 can achieve.

As described above for tower 402, fan 55" of cooling tower 403 operates to pull ambient air into air inlet 35", through air-to-water heat exchanger 230', through the wet fill, past the water distribution system with nozzles 51", through the mist eliminator 71", up through fan 55" and finally out air outlet 40" of cooling tower 403. Pump 60" pumps water from cold-water reservoir 20", through pipe 65", to cooling loads 11" and MU Air Handling Unit 715. The warm water from the above loads is returned back to cooling tower 403 through pipe 66". Pipe 66" connects to the water distribution system with nozzles 51" of cooling tower 403, which evenly distributes water across the top of the fill. As the water falls by gravity through the fill of cooling tower 403, it interacts with the moving pre-cooled air stream that has been pre-cooled by air-to-water heat exchanger 230. The air-water interaction within cooling tower 403 causes some water to evaporate. This evaporation extracts (heat) energy out of the circulating water stream and transfers this energy to the interacting air stream of cooling tower 403. The cold water obtained by the result of the above air-water interaction is collected in cold-water reservoir 20". The journey of the cold water begins again as pump 60" pumps water from cold-water reservoir 20" to cooling loads 11" and MU Air Handling Unit.

The first cooling state, comprising cooling tower 401, produces cold water that approaches the wet bulb temperature of the ambient air. This cold-water services air-to-water heat exchanger 230, a pre-cooling heat exchanger, located at air inlet 35' of cooling tower 402. Cooling tower 402 composes part of cooling stage 2. Since the cooling system operates to provide pre-cooled air ultimately to cooling tower 402, when cooling stage 2 comprising cooling tower 402 operates, it produces water that is colder than the cold water produced by cooling stage 1. This colder water ultimately provides cooling tower 403 with air that has an even lower wet bulb and dry bulb temperature than previous stages allowing cooling tower 403 to produce cold water that is even colder than the cold water produced in the second cooling stage.

Each of cooling towers 402 and 403 uses pre-cooled air that has a lower wet bulb temperature than ambient air. Using the pre-cooled air allows these cooling towers to reach significantly lower cold-water temperatures and exhaust air temperatures than cooling towers without air pre-cooling. In some examples, the cold exhaust air exiting the cooling towers is utilized as a source of energy by the Energy Recovery Systems to produce further useable cold water or cold air and to produce additional energy savings as compared to traditional cooling methods. Such an embodiment is depicted in FIG. 14.

The cooling system depicted in FIG. 14 functions substantially similarly to that of the cooling system of FIG. 13.

In addition to the cold water generated by the cooling towers, such as cooling towers 501, 502, 503, the cooling towers generate exhaust air that is colder than ambient air and can be utilized as a significant energy source for additional cooling loads. The exhaust air exits the cooling towers through air outlets 40, 40', 40". In some examples, dampers 340, 340', 340" control exhaust air flow out of the respective cooling towers. These dampers divert the exhaust airflow from cooling tower air outlets 40, 40', 40". Dampers 340, 340', 340" can direct exhaust air streams in the following optional ways. Option A—the dampers direct 100% of the exhaust air through energy recovery systems 330, 330', and 330". Option B—the dampers direct 100% of the exhaust air through air outlet 40, 40', 40" to the outside atmosphere bypassing the energy recovery systems. Option C—based on cooling load demands, the dampers split the exhaust air stream in any desired ratio between energy recovery systems 330, 330', 330" and exhaust air outlets 40, 40', 40".

As seen in FIG. 17, energy recover system 330 functions to reclaim some of the "coldness" from the cooling tower exhaust air by using internal fan 835 to move cool exhaust air past air-to-water heat exchangers 830 in ERS 330. This cold source can be used to service any appropriate cooling load that one of ordinary skill in the art would consider suitable. Warm water enters air-to-water heat exchangers 830 through warm water inlet pipe 866 and travels through air-to-water heat exchangers 830 where the water gives off heat to the air stream flowing out of the cooling tower. Next cold water flows from the cold-water outlet of air-to-water heat exchangers 830 into cold-water outlet pipe 865. Cold-water outlet pipe 865 carries the cold water to the cold-water inlet of cooling load 811 where the cold water picks up heat from cooling load 811 and flows through the warm water outlet of cooling load 811, through pump 860 into warm water inlet pipe 866 to begin the cycle again. Pump 860 drives the flow through the closed loop system.

To present a better understanding of the design and operational specifics of the MECS, demonstration of its cooling capability and performance, and for eventual comparison with a Conventional Mechanical Refrigeration System, the following design conditions are used to provide a comparable engineering analysis for both systems performing equal tasks:

EXAMPLES

Example 1

Cooling Application a) Cool a conditioned space with the summer design sensible cooling load of approximately 92 tons of equivalent refrigeration.
b) Project Location—Phoenix, Ariz.
c) The ASHRAE specified design ambient air parameters for Phoenix Ariz. for cooling applications are 110.2° F. DB and 70° F. WB.
d) The ASHRAE specified design ambient air parameters for Phoenix Ariz. for evaporation applications for 0.4% are 76.1° F. WB and 96.4° F. MCDB (Mean Coincident dry bulb temperature). (For reference only)
e) The indoor design air temperature is approximately 80° F. DB at a comfortable 40 to 65% relative humidity range.
f) The preliminary estimate of required volume of makeup/supply cooled air into the conditioned space is approximately 35,000 CFM.

These calculations are provided as illustrative example only for the exemplary system described herein. They do not limit the invention in any way and are only provided to guide the user in implementing other equivalent implementations of the invention.

Typical MECS engineering design and component list selected for performing the above-mentioned cooling.

The MECS is configured for this particular application, and it consists of the following main components:

Three induced draft counter flow cooling towers or comparable Air Washers; variable speed exhaust air fans; and variable flow circulating water pumps; and.

Pre-cooling coils located at the ambient air inlets of the cooling towers.

The components of makeup air-handling unit 715 sit in the following sequence and following the airflow direction. Powered by a fixed or variable speed supply fan 735, ambient air passes through the air inlet 720 of makeup air-handling unit 715. Then it passes through air particulate filter(s) 750 and air-to-air heater exchanger 745. Airflow through air-to-air heat exchanger 745 is assisted by fan 755. This airflow is building exhaust air, which pre-cools ambient air destined for introduction into the building. Next, it reaches cooling coil 740. Cold water is pumped from a cooling stage of a cooling system, through pipe 65' through the cold-water inlet 213 to cooling coil 740 of makeup air-handling unit 715 and then through the heat exchanger warm water outlet 214 to pipe 66' back to the cooling system. As air passes over cooling coil 740, it gives off heat to the cold water causing the temperature of the air to fall providing sensible cooling.

In applications where the space does not required 100% ambient air but still has the same space cooling load, the air-to-air heat exchanger 745 could be replaced with an air-mixing module (not shown). The air-mixing module mixes large volumes of lower temperature return air from the conditioned space with the minimal required volume of ambient air (ventilation air). This mixed air application will significantly reduce the total energy consumption of the MECS. (Note: If this air-mixing application is implemented, the need for humidification is greatly reduced or eliminated in most cases.)

Return Air Sub-System (RA Sub-System)—the RA Sub-System contains ductwork, an adiabatic humidification chamber, and return air exhaust fan. The RA Sub-System controls temperature, humidity, and air volume of the return air stream being fed to one side of the air-to-air heat exchanger 745 or to the air-mixing module.

The integrated MECS contains the following sequential process cooling stages:

Cooling Stage-1 (Water Cooling)

Figure 15:
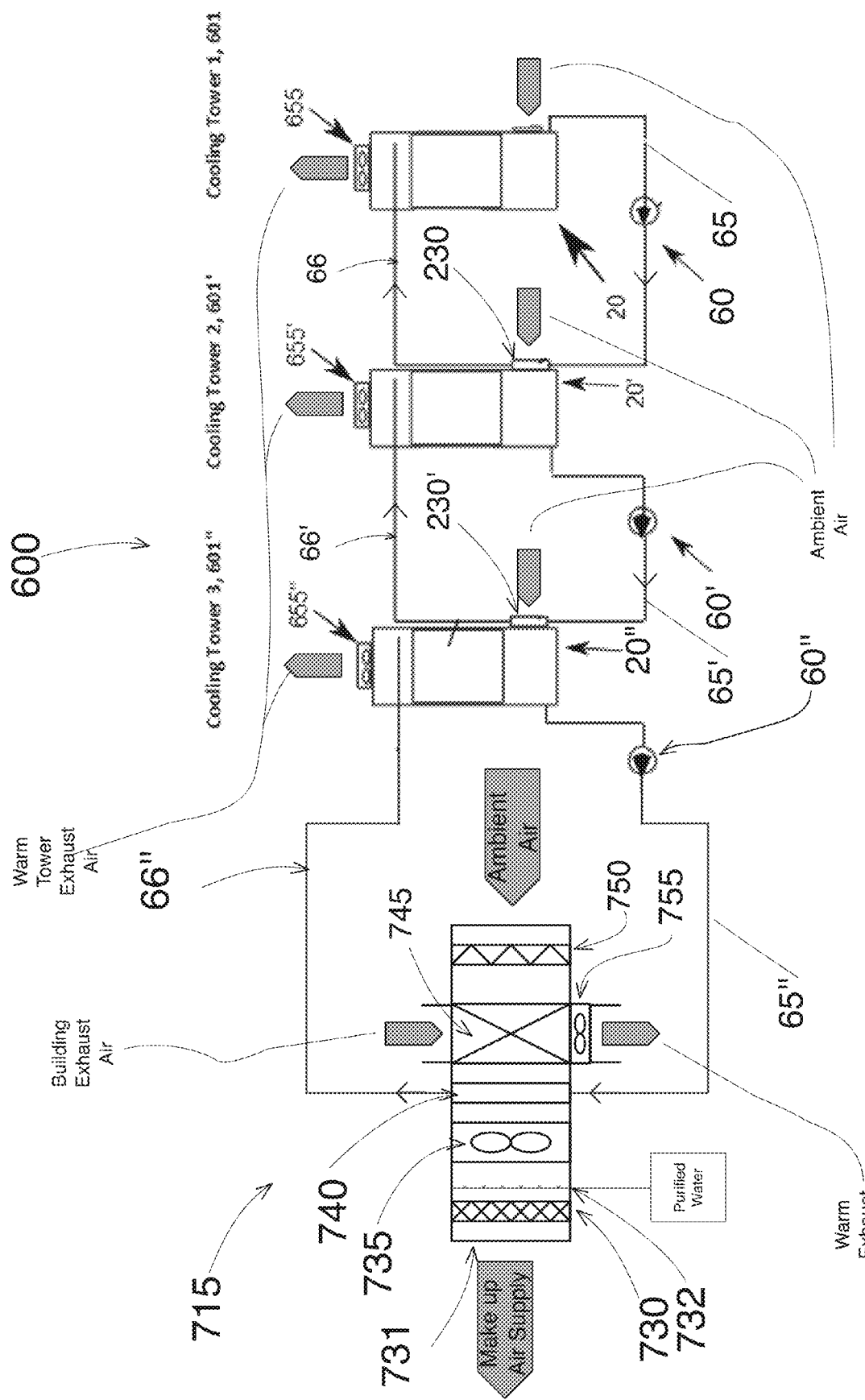
FIG. 15 depicts another cooling system embodiment.
Figure 16:
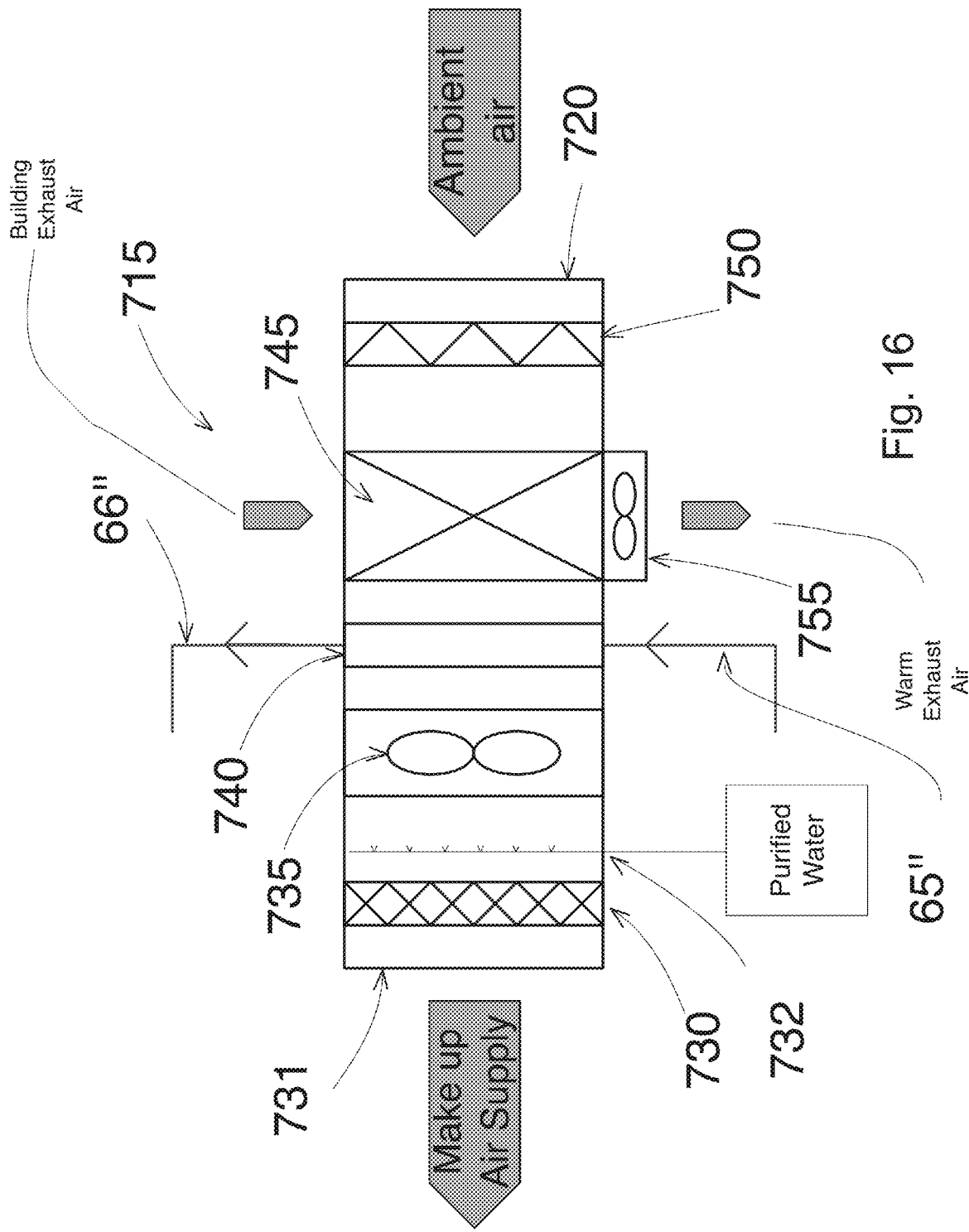
FIG. 16 depicts a makeup air-handling unit.

From FIG. 15, this cooling stage comprises cooling tower 601 and a water pump 60. Cooling tower 601 generates cold water that collects in its cold-water reservoir 20. Cooling stage-1 generates cold water for pre-cooling ambient air entering into the next stage cooling towers. The cooling coil (air-to-water heat exchanger 230) pre-cools ambient air entering into the next stage cooling tower 601' using some of the cold water from cooling tower 601.

Cooling Stage-2 (Water Cooling)

This cooling stage comprises a second cooling tower 601', a water pump 60', and a cooling coil (air-to-water heat exchanger 230'). Cooling tower 601' generates cold water that collects in its cold-water reservoir 20' and supplies cold water to the air-to-water heat exchanger 230' of the third cooling tower 601".

Cooling Stage-3 (Water Cooling)

This cooling stage comprises third cooling tower 601", a water pump 60", and a cooling coil (air-to-water heat exchanger 230'). Cooling tower 601" generates cold water that collects in its cold-water reservoir 20", and supplies cold water to a cooling coil (air-to-water heat exchanger 740) installed in the housing of makeup air-handling unit 715 or some other cooling load or process cooling load.

Cooling Stage-4 (Makeup Air Cooling)

This cooling stage comprises a cooling coil (air-to-water heat exchanger 740) installed in the makeup air-handling unit. The cooling coil (air-to-water heat exchanger 740) receives cold water from third cooling tower 601. The cooling coil (air-to-water heat exchanger 740) sits in the housing of makeup air-handling unit 715 downstream of an air-to-air heat exchanger 745 and can either cool air leaving the air-to-air heat exchanger 745 or, if the air-to-air heat exchanger is not included, precools warm ambient air as it enters into the makeup air-handling unit 715.

Cooling Stage-5 (Makeup Air Cooling)

This stage is the final cooling stage inside of the makeup air-handling unit 715. It provides adiabatic cooling of the supply air using any suitable direct evaporative cooling system 732, such as using high pressure fogging nozzles.

Cooling Stage-6 (Return Air Cooling)

This cooling stage is a part of the return air RA Sub-System, combining the return air (RA) ductwork, evaporative air humidification chamber, and the RA exhaust fan. The humidification chamber comprises a humidifier that could be either a high-pressure water dispersion type, or any other evaporative humidifier type appropriate for the application. The purpose of cooling stage-6 is to provide high-efficiency adiabatic cooling of the RA stream before its heat exchange interaction with the warm ambient air stream in the air-to-air heat exchanger 745, or before mixing with ambient air (ventilation air) in the air-mixing module, if the cooling system is configured to use an air-mixing module.

Cooling Stage-7 (Makeup Air Cooling)

This cooling stage is an air-to-air heat exchanger and its function is to pre-cool outside warm air using the lower temperature return air stream from the conditioned space and thereby reduce the MECS total energy use.

Different cooling applications call for varying MECS configurations.

Each MECS is configured to produce the required amount of cooling for a defined application, such as conditioned space or process cooling for industry. Each design factors in the peak cooling demand at summer conditions for the local environment.

The MECS has a dedicated control and monitoring system with appropriate software to provide optimum, moment-to-moment control over operating parameters that yield the required amount of cooling at minimal power consumption based on constantly changing building cooling loads, process cooling loads, and ambient air conditions.

MECS Cooling Stages—Divided into Water and Air Cooling Stages

Described in a different way, in general, all cooling stages of MECS fall into two states: a water-cooling stage and an air-cooling stage.

A. Water Cooling Stages

The three water-cooling stages of the MECS use three cooling towers 601,601',601" with each stage having a cooling tower, a cooling coil (optional in the first cooling tower), and a pump arranged in series to provide a cascade of cooling stages. That is, the cooling tower of a preceding stage generates cold water similarly to prior art cooling towers. This cold water is used to pre-cool the incoming air of a succeeding stage, allowing the cooling tower of the succeeding stage to produce cooler water than was possible in the preceding stage. In some examples, this cascading of one cooling tower after another with a lower stage bolstering the cooling ability of a higher stage continues, giving cooling systems with 3, 4, 5, or more successive stages, each stage capable of producing cold water at successively colder temperatures.

MECS operation begins with a command from the central computer of the energy management system and from the local programmable logic controller. The operation of the MECS takes place in the following sequential steps:

Step-1

The fan 655 of the first cooling tower 601 starts, using a slow start method. Water circulating pump 60 starts, using a slow start method. The pump 60 takes cold water from the cold-water reservoir 20 and directs the water to pre-cooling coils (air-to-water heat exchanger 230') installed at the ambient air intakes of another cooling tower(s), respectively. Water, warmed by pre-cooling coils, returns to the source cooling tower and distributes the water evenly over the top of cooling tower fill, positioning it for continuing the evaporative cooling cycle.

Step-2

The fan 655' in the second cooling tower 601' starts, using a slow start method. The water-circulating pump 60' starts, using a slow start method. The pump 60' takes cold water from cold-water reservoir 20' and directs the water to pre-cooling coil (air-to-water heat exchanger 230') installed at the ambient air intakes of the next stage cooling tower 601". Warmed water from the pre-cooling coil returns to the source cooling tower 601' and distributes the water evenly over the top of the fill of the cooling tower for continuing the evaporative cooling cycle.

Step-3

The fan 655" of the third cooling tower 601" starts, using a slow start method. The water circulating pump 60" starts, using a slow start method. The pump 60" takes cold water from the cold-water reservoir 20" and directs the water to pre-cooling coil (air-to-water heat exchanger 740') installed in the makeup air-handling unit 715. The warm water from the pre-cooling coil returns to the source cooling tower 601' and distributes the water evenly over the top of the fill for continuing the evaporative cooling cycle.

Due to the heat-mass transfer process taking place in the fill of all cooling towers, part of the water falling over the cooling tower fill evaporates and this evaporation process lowers the temperature of the remaining water that is falling through the cooling tower and collected in the cold-water reservoirs. The dry bulb temperature of ambient air entering into the pre-cooling coils is higher than the temperature of the cooling coil cooling water. The pre-cooling coils extract some amount of heat from the ambient air and, as a result, the dry bulb and wet bulb temperatures of the ambient air falls (is lowered). The calculations for the embodiment assume approach temperatures for cooling towers 2° F., and approach temperatures for pre-cooling coils 3° F.

These approach temperatures have been selected as illustrative examples only for the exemplary system described herein. Other approach temperatures may be applied that will provide a varying degree of results. The cooling towers may have approach temperatures that are different from one another or that are the same. Pre-cooling coils may have approach temperatures that are different from one another or that are the same.

Step-4

Supply fan 735 of makeup air-handling unit 715 starts, using a slow start method.

Step-5

The RA exhaust fan of the RA Sub System starts, using the slow start method.

Step-6

After the cooling system achieves the desired cold air supply from the makeup air-handling unit and achieves the desired temperature for the air leaving the pre-cooling coil, the control system, based on established parameters, activates the humidifier 730 at its minimum capacity and gradually adjusts its humidification capacity to humidify air as set out in the specific design specifications of the application for the conditioned space.

Step-7

After the cooling system achieves the desired cold air supply from the makeup air-handling unit 715, the control system adjusts and regulates the return air fan to meet the desired volume of return air.

Step-8

After the supply and return airflows are balanced as desired, the control system activates the humidifier in the RA Sub System at its minimum capacity and gradually adjusts its humidification capacity until it optimizes the humidification level to provide the lowest possible temperature of the return air stream. Lower air stream temperatures at this point provide maximum pre-cooling of ambient air in the air-to-air heat exchanger.

Example 2

The following estimates show cold water temperatures leaving the cooling towers for a cooling system design based on summer ambient air conditions for Phoenix, Ariz., and according to the MECS (cooling system) design. Since ASHAE-specified design ambient air parameters for Phoenix, Ariz., for evaporation applications for 0.4% are 76.1° F. WB and 96.4° F. MCDB (evaporative application) exist at peak conditions for only a very short cooling time, these analysis and calculations focus on the ASHRAE Cooling Application corresponding to ambient air parameters for Phoenix, Ariz., of 110.2° F. DB and 70.0° F. WB temperatures. These parameters approximate some of the least favorable conditions for using evaporative cooling systems in Phoenix.

The estimated theoretical temperatures of cold water exiting any cooling tower with a design approach temperature of 2° F. operating at the design ambient air conditions of 76.1° F. WB and 96.4° F. MCDB (evaporative application) without using pre-cooling coils is approximately 78.1° F.

The estimated theoretical temperatures of cold water exiting a similarly designed cooling tower operating while not using a pre-cooling coil and cooling towers operating while using pre-cooling coils at the design ambient air conditions of 76.1° F. WB and 96.4° F. MCDB (evaporative application) are approximately 78.1° F., 73.6° F. and 72.6° F., respectively.

The estimated theoretical temperatures of cold water exiting any cooling tower with a design approach temperature of 2° F. (operating without pre-cooling coils) at the design ambient air conditions of 110° F. DB and 70° F. WB (cooling application) is approximately 72° F.

The estimated theoretical temperatures of cold water exiting a similarly designed cooling tower operating while not using a pre-cooling coil and second and third stage cooling towers operating while using pre-cooling coils at the design ambient air conditions of 110° F. DB and 70° F. WB (cooling application) are approximately 72° F., 60.2° F. and 55.5° F., respectively.

The design approach temperature for all the cooling towers is 2° F. The design approach temperature for all cooling coils in this calculation is 3° F. But approach temperatures may change to meet specific cooling design applications for specific locations and design parameters and will result in varying cooling results.

It should be noted that the estimated temperature values of cold water shown above for the cooling and evaporative applications does not include the pre-cooling of ambient air in the cooling coil located at the air intake of the first cooling tower. If the MECS design includes the cooling effect of the cooling coil, the water temperatures leaving the next stage cooling towers would be lower.

Sequential Cold Water Temperature Chain of the MECS Water Cooling Stages

The temperature of cold water exiting the third cooling tower is approximately 55.5° F., lower than the temperature of cold water exiting the second cooling tower, and the temperature of cold water exiting the second cooling tower is approximately 60.2° F., lower than the temperature of cold water exiting the first cooling tower, which is approximately 72° F. Another means of stating the above is that the temperature of cold water exiting cooling towers is that the third cooling tower is approximately 55.5° F., which is less than the second cooling tower of approximately 60.2° F., which is less than the first cooling tower of approximately 72° F. In this design example, the initial ambient air wet bulb temperature is 70° F. Therefore, in this example, an invention cooling system provides evaporatively cooled cold water exiting the final cooling tower at approximately 55.5° F., which is lower than the 70° F. initial wet bulb temperature of the ambient air.

Some invention cooling systems achieve these effects using various methods and systems consisting of the following:

Pre-cooling the ambient air entering into the cooling tower(s) with cooling coil(s) to provide sensible cooling of the entering air for lowering the ambient air's dry bulb and wet bulb temperatures.

If more than one cooling tower is arranged in series (cascaded) to meet a specific application, cold water from a first stage cooling tower is supplied to the cooling coil of the second cooling tower and to other optional cooling loads. Cold water from a second-stage cooling tower is supplied to the cooling coil to a third or subsequent stage cooling towers and to other optional cooling loads. Cold water from a second, third, or greater stage is supplied to the cooling coil in the makeup air-handling unit and may be supplied to other optional cooling loads.

For the specific local design conditions and specific cooling application, the piping system configuration supplying cold water or cold air to the air or water cooling loads can be modified to provide flexibility in operating any combination of cooling towers.

In all cases, invention methods of arranging the cooling towers in a series/cascade providing for the operation of the cooling tower combinations using special direct/indirect evaporation techniques is able to generate cold water with a final temperature lower than the initial wet bulb temperature of ambient air. The temperature of cold water generated by MECS can be used to satisfy a majority of HVAC and process cooling applications while using significantly lower energy as compared to conventional mechanical refrigeration systems.

Air Cooling Stages

The makeup air-handling unit cools the makeup air for this particular application. The makeup air-handling unit comprises a pre-cooling coil providing sensible cooling (cooling stage-4) of the ambient air, an evaporative humidifier providing additional (if necessary) adiabatic cooling of the makeup air (cooling stage-5), and either an air-to-air heat exchanger (cooling stage-7) or air-mixing section or both use the return air from the conditioned space.

Cooling Stage-4 (Makeup Air Cooling)

The makeup air-handling unit fan pulls the required amount of the makeup (ambient) air into the makeup air-handling unit housing through the air intake louver. The air then passes through the air filter section, the air-to-air heat exchanger section, and enters into the pre-cooling coil, which cools makeup air using cold water supplied from cooling tower. (Note: At this point, it is not assumed that an air-to-air heat exchanger is incorporated thereby facilitating the next statement.) Air enters pre-cooling coil at conditions of 110.2° F. DB and 70° F. WB temperature and leaves pre-cooling coil at approximately 58.5° F. DB and 51.5° F. WB temperature. The sensible cooling load for pre-cooling coil for a cooling application described herein is approximately 168.0 tons of equivalent refrigeration.

Note: For demonstration of the available cooling capacity of the MECS, we do not take into consideration the heat rejected from the ambient air stream by pre-cooling the return air stream in the air-to-air heat exchanger.

Cooling Stage-5 (Makeup Air Cooling)

Cooling Stage-5 further increases cooling capacity of the cooled supply air, reducing its dry bulb temperature by means of adiabatic cooling of ambient air coming through the pre-cooling coil. Cooling Stage-5 comprises an evaporative air humidifier installed in the makeup air-handling unit housing downstream of the supply air fan. The adiabatic cooling capacity of cooling stage-5 is approximately 96,485 BTU/hr or 8 tons of equivalent refrigeration. The humidifier could be either a high-pressure water dispersion type or any other type of evaporative humidifier appropriate for the application. The integrated part of the cooling stage-5 is a mist eliminator situated downstream of the humidifier. The parameters of the supply air leaving cooling stage 5 and entering into the conditioned space are approximately 51.8° F. DB and 51.3° F. WB at the total supply airflow rate of approximately 35,000 CFM (air mass flow is equivalent to 160,809 lbs/hr). Assuming a condition space temperature of 80° F. DB, the assimilating sensible cooling capacity of the supply air is approximately 92 tons of equivalent refrigeration.

Cooling Stage-6 (Return Air Cooling)

The air cooling stage-6 provides the high-efficiency adiabatic cooling of the RA stream to reduce its temperature as low as possible before its heat exchange interaction with the warm ambient air stream in the air-to-air heat exchanger which is part of cooling stage-7. This air cooling stage-6 is a part of the RA Sub-System, combining the RA ductwork, evaporative air humidification chamber, and the air-to-air heat exchanger physically located in the makeup air-handling unit housing. The humidification chamber comprises the humidifier, which could be either a high-pressure water dispersion type or any other appropriate type of evaporative humidifier matching the application. The integrated part of cooling stage-6 is a mist eliminator situated downstream of the humidifier in the humidification chamber.

Cooling Stage-7 (Makeup Air Cooling)

Cooling Stage-7 allows significant reduction in the total energy usage by the MECS, especially at peak conditions, by pre-cooling ambient air using the lower temperature return air from the conditioned space. In our case, the estimated temperature of the adiabatically cooled RA entering the air-to-air heat exchanger could be within approximately 75-76° F. DB range while the temperature of ambient air entering the air-to-air heat exchanger is 110.2° F. DB. The anticipated heat transfer efficiency of the heat exchanger with the above interacting airstreams is approximately 70%.

Cooling Stage-7 consists of an air-to-air heat exchanger situated at ambient air intake of the makeup air-handling unit, RA exhaust fan, and RA ductwork. The RA exhaust fan is installed at the strategic location-downstream of the air-to-air heat exchanger. This location of the RA exhaust fan makes the following positive energy impacts:

It increases the total amount of heat extracted from the warm ambient air stream by eliminating the fan heat going to the RA stream resulting in the production of cooler makeup air entering into pre-cooling coil and reducing the cooling load on the pre-cooling coil.

It decreases the required amount of cold water used by pre-cooling coil, and reduces the energy consumption of all the operating cooling towers and their respective water circulating pump(s).

The makeup air-handling unit of the MECS supplies into the conditioned space approximately 35,000 CFM of cooled air at the estimated parameters of 51.8° F. DB and 51.31° F. WB. The initial design parameters of ambient air entering into the makeup air-handling unit are 110.2° F. DB and 70° F. WB temperatures. The indoor air design parameters for the conditioned space are approximately 80° F. DB and 62.3° F. WB temperatures. The cooling capacities of the air cooling stages of the makeup air-handling unit are:

Air Cooling Stage-4 168 tons of equivalent refrigeration.
Air Cooling Stage-5 (sensible equivalent adiabatic cooling) 8 tons of equivalent refrigeration.

The total gross air cooling capacity of the makeup air-handling unit in this example is approximately 176 tons of equivalent refrigeration. The total sensible cooling load for cooling 160,809 lbs/hr of ambient air mass at initial temperatures of 110.2° F. DB and 70° F. WB to supply air temperatures of 51.8° F. DB and 51.3° F. WB is approximately 170 tons of equivalent refrigeration. Therefore, to cool specified amounts of ambient air from the initial design parameters to the specified parameters of the supply requires a net of approximately 170 tons of equivalent refrigeration.

35,000 CFM (mass flow rate 160,809 lbs/hr) of supply air at approximate conditions of 51.8° F. DB and 51.3° F. WB temperatures can provide specified indoor air conditions of 80° F. DB and relative humidity of 62.3% in the conditioned space. The corresponding net sensible cooling capacity of the cold supply air is approximately 92 tons of equivalent refrigeration.

Note: The design parameters of the return air exiting the conditioned space and entering into RA Sub-System are approximately 80° F. DB and 62.3° F. WB temperatures.

TABLE 7

Carbon Footprint Comparison of Traditional Data Center Cooling Systems to the Natural Cycle Energy, Inc. RTDCCS (From example above: 2000 KW and 569 tons of cooling). The carbon output per kWh assumed is 0.524 pounds per kWh based on Pacific Gas and Electrics published numbers.

| | Traditional | RTDCCS | Reduction in | % | | | | Environmental Impact per kW of Energy Savings | | |
|---|---|---|---|---|---|---|---|---|---|---|
| | DC Cooling LBs of Carbon Released | LBs of Carbon Released | Carbon Footprint LBs Released | Reduction in Carbon Footprint | Tons of CO2 Reduced | Equivalent Mid - Sized Cars* | # of Trees to Offset/YR | Tons of CO2 Reduced | Equivalent Mid Sized Cars | # of Trees to Offset/YR |
| CRAC Cooled System | 7,541,693 | 1,806,864 | (5,734,829) | 76.0% | 2867 | 434 | 14,337 | 1.43 | 0.22 | 7.17 |
| CRAH Cooled System - Chilled Water Based | 7,078,642 | 1,806,864 | (5,271,778) | 74.5% | 2636 | 399 | 13,179 | 1.32 | 0.20 | 6.59 |
| CRAC Cooled System w/ Containment | 6,976,810 | 1,806,864 | (5,169,946) | 74.1% | 2585 | 392 | 12,925 | 1.29 | 0.20 | 6.46 |
| CRAH Cooled System w/ Containment | 6,615,044 | 1,806,864 | (4,808,180) | 72.7% | 2404 | 364 | 12,020 | 1.20 | 0.18 | 6.01 |
| Liquid Cooled Racks Unoptimized | 6,181,605 | 1,806,864 | (4,374,741) | 70.8% | 2187 | 331 | 10,937 | 1.09 | 0.17 | 5.47 |
| Liquid Cooled Racks Chilled Water Temperature Optimized | 4,491,060 | 1,806,864 | (2,684,196) | 59.8% | 1342 | 203 | 6,710 | 0.67 | 0.10 | 3.36 |

TABLE 7-continued

Carbon Footprint Comparison of Traditional Data Center Cooling Systems to the Natural Cycle Energy, Inc. RTDCCS (From example above: 2000 KW and 569 tons of cooling). The carbon output per kWh assumed is 0.524 pounds per kWh based on Pacific Gas and Electrics published numbers.

| | Traditional | RTDCCS | Reduction in | % | | | | Environmental Impact per kW of Energy Savings | | |
|---|---|---|---|---|---|---|---|---|---|---|
| | DC Cooling LBs of Carbon Released | LBs of Carbon Released | Carbon Footprint LBs Released | Reduction in Carbon Footprint | Tons of CO2 Reduced | Equivalent Mid-Sized Cars* | # of Trees to Offset/YR | Tons of CO2 Reduced | Equivalent Mid Sized Cars | # of Trees to Offset/YR |
| Liquid Cooled Racks Chilled Water Temperature Optimized and Free Cooling Systems | 3,638,803 | 1,806,864 | (1,831,939) | 50.3% | 916 | 139 | 4,580 | 0.46 | 0.07 | 2.29 |
| Liquid Cooled Racks Chilled Water Temperature Optimized and Evaporative Free Cooling Systems | 3,146,875 | 1,806,864 | (1,340,011) | 42.6% | 670 | 102 | 3,350 | 0.34 | 0.05 | 1.68 |
| Active Liquid Cooled Doors, Chilled Water Temperature Optimized and Evaporative Free Cooling Systems | 3,054,965 | 1,806,864 | (1,248,101) | 40.9% | 624 | 95 | 3,120 | 0.31 | 0.05 | 1.56 |
| Passive Liquid Cooled Doors, Chilled Water Temperature Optimized and Evaporative Free Cooling Systems | 2,428,306 | 1,806,864 | (621,442) | 25.6% | 311 | 47 | 1,554 | 0.16 | 0.02 | 0.78 |
| Pumped Refrigerant Systems | 4,535,449 | 1,806,864 | (2,728,585) | 60.2% | 1364 | 207 | 6,821 | 0.68 | 0.10 | 3.41 |
| Air Side Economizing | 3,699,380 | 1,806,864 | (1,892,516) | 51.2% | 946 | 143 | 4,731 | 0.47 | 6.07 | 2.37 |

*Carbon Calculator (1000 miles driven per month) Environmental Impact per KW of Energy Savings While particular embodiments of the present invention have been shown and described, it will be obvious to those skilled in the art that changes and modifications can be made without departing from the embodiments of this invention in its broader aspects and, therefore, the appended claims are to encompass within their scope all such changes and modifications as fall within the true, intended, explained, disclose, and understood scope and spirit of this invention's multitudinous embodiments and alternative descriptions.

Additionally, various embodiments have been described above. For convenience's sake, combinations of aspects composing invention embodiments have been listed in such a way that one of ordinary skill in the art may read them exclusive of each other when they are not necessarily intended to be exclusive. But a recitation of an aspect for one embodiment is meant to disclose its use in all embodiments in which that aspect can be incorporated without undue experimentation. In like manner, a recitation of an aspect as composing part of an embodiment is a tacit recognition that a supplementary embodiment exists that specifically excludes that aspect. All patents, test procedures, and other documents cited in this specification are fully incorporated by reference to the extent that this material is consistent with this specification and for all jurisdictions in which such incorporation is permitted.

Moreover, some embodiments recite ranges. When this is done, it is meant to disclose the ranges as a range, and to disclose each and every point within the range, including end points. For those embodiments that disclose a specific value or condition for an aspect, supplementary embodiments exist that are otherwise identical, but that specifically exclude the value or the conditions for the aspect.

The invention claimed is:

1. A system comprising:
a first-stage cooling assembly that comprises a forced-draft cooling tower having:
an ambient air inlet,
an air outlet,
a cold water reservoir disposed at a bottom of the first-stage cooling tower,
a variable speed fan disposed adjacent to the first-stage air outlet, dedicated to the first-stage cooling tower, and configured to variably control air flow through the first-stage cooling tower,
and
a variable flow water pump;
a final-stage cooling assembly that comprises a forced-draft cooling tower having:
an air inlet,
an air outlet,
a cold water reservoir disposed at a bottom of the final-stage cooling tower,
a variable speed fan disposed adjacent to the final-stage air outlet, dedicated to the final-stage cooling tower, and configured to variably control air flow through the final-stage cooling tower,
an air-to-water heat exchanger at the air inlet of the final-stage cooling tower, and
a variable flow water pump that is adapted to pump cold water through final-stage supply piping;
wherein the first-stage variable flow water pump pumps cooling fluid from the first-stage cold water reservoir through the first-stage supply piping to, and the cooling fluid from the first stage-cooling tower is in indirect heat exchange relationship with, two or more of the following heat exchangers:
the air-to-water heat exchanger serving the air inlet of the final stage cooling tower;
a intermediate-stage cooling load heat exchanger serving an air inlet of an optional intermediate-stage cooling tower;
or
a heat exchanger serving a third cooling load other than the intermediate-stage or final stage air inlet heat exchangers;
wherein warmed water is returned directly to wet media of the first-stage cooling tower and then upon being cooled flows down into the first-stage cold water reservoir for reuse,
wherein the final-stage variable flow water pump pumps cooling fluid from the final-stage cold water reservoir through the final-stage supply piping to a cooling coil unit of an individual server enclosure cooling system and warmed water is returned directly to wet media of the final-stage cooling tower and then upon being cooled flows down into the final-stage cold water reservoir for reuse,
wherein the cooling fluid from the final stage cooling tower is in indirect heat exchange relationship with the cooling coil unit of an individual server enclosure cooling system,
but wherein the first-stage variable flow water pump does not circulate cold water to an air-to-water heat exchanger servicing the ambient air inlet of the first stage cooling tower;
and
the individual server enclosure cooling system that comprises:
a housing;
the cooling coil unit which includes a cooling coil mounted in the housing wherein the cooling coil is adapted to circulate a volume of cold water;
a fan tray including at least one fan wherein the fan tray is located within or services the housing;
and
a computer-based command-and-control system in signal communication with one or more sensors configured to sense cooling parameters,
wherein the housing of the individual server enclosure cooling system connects to a single server enclosure rack.

2. The system of claim 1 additionally comprising:
an intermediate-stage cooling assembly that comprises a forced-draft cooling tower having:
an air inlet,
an air outlet,
a cold water reservoir disposed at a bottom of the intermediate-stage cooling tower,
a variable speed fan disposed adjacent to the intermediate-stage air outlet, dedicated to the intermediate-stage cooling tower, and configured to variably control air flow through the intermediate-stage cooling tower,
a pre-cooling coil at the air inlet of the intermediate-stage cooling tower,
and
a variable flow water pump that is adapted to pump cold water through intermediate-stage supply piping;
wherein the intermediate-stage variable flow water pump pumps cooling fluid from the intermediate-stage cold water reservoir through the intermediate-stage supply piping to, and the cooling fluid from the intermediate stage-cooling tower is in indirect heat exchange relationship with, two or more of the following heat exchangers:
the final cooling load heat exchanger serving the air inlet of the final stage cooling tower;
an intermediate cooling load heat exchanger serving the air inlet of another optional intermediate-stage cooling tower;
or
a heat exchanger serving a third cooling load other than the intermediate-stage or final stage air inlet heat exchangers;
and wherein warmed water is returned directly to wet media of the intermediate-stage cooling tower and then upon being cooled flows down into the intermediate-stage cold water reservoir for reuse.

3. The system of claim 1 wherein the fan tray further comprises at least one additional fan.

4. The system of claim 3 wherein the cooling coil unit further comprises at least one additional cooling coil.

5. The system of claim 4 wherein the computer-based command-and-control system monitors the cooling parameters.

6. The system of claim 5 wherein monitoring cooling parameters encompasses evaluating an instantaneous value of the cooling parameters.

7. The system of claim 6 wherein one of the cooling parameters is air temperature.

8. The system of claim 7 wherein the cooling parameter is measured in the server enclosure rack.

9. The system of claim 8 wherein the computer-based command-and-control system adjusts at least one cooling control that manipulates a control parameter.

10. The system of claim 9 wherein the control parameter comprises fan speed.

11. The system of claim 2 wherein the computer-based command-and-control system monitors a cooling parameter by evaluating the instantaneous value of the cooling parameters.

12. The system of claim 11 wherein one of the cooling parameters is air temperature.

13. The system of claim 12 wherein the cooling parameter is measured in the individual server enclosure cooling system.

14. The system of claim 13 wherein the computer-based command-and-control system adjusts at least one cooling control that manipulates a control parameter.

15. The system of claim 14 wherein the computer-based command-and-control system is capable of adjusting one or more cooling parameters such that the average temperature of air exiting the individual server enclosure cooling system remains within 3 degrees of a set point temperature.

* * * * *